United States Patent
Tajima et al.

(10) Patent No.: US 9,939,475 B2
(45) Date of Patent: Apr. 10, 2018

(54) PHASE FREQUENCY DETECTION DEVICE

(71) Applicant: Mitsubishi Electric Corporation, Tokyo (JP)

(72) Inventors: Kenichi Tajima, Tokyo (JP); Kazuhide Higuchi, Tokyo (JP); Morishige Hieda, Tokyo (JP); Takuya Suzuki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/547,539

(22) PCT Filed: Mar. 4, 2015

(86) PCT No.: PCT/JP2015/056365
§ 371 (c)(1),
(2) Date: Jul. 31, 2017

(87) PCT Pub. No.: WO2016/139778
PCT Pub. Date: Sep. 9, 2016

(65) Prior Publication Data
US 2018/0003750 A1    Jan. 4, 2018

(51) Int. Cl.
*G01R 23/12* (2006.01)
*H03H 17/02* (2006.01)
*G01R 25/00* (2006.01)

(52) U.S. Cl.
CPC .............. *G01R 23/12* (2013.01); *H03H 17/02* (2013.01); *G01R 25/00* (2013.01)

(58) Field of Classification Search
CPC ........ G01R 23/12; G01R 23/00; H03H 17/02; H03H 2017/0081; H03H 2017/009
See application file for complete search history.

(56) References Cited

U.S. PATENT DOCUMENTS 5,444,416 A    8/1995    Ishikawa et al.
2003/0052662 A1    3/2003    Bi et al.

FOREIGN PATENT DOCUMENTS

JP    S63-258105 A    10/1988
JP    H06-216651 A    8/1994
(Continued)

OTHER PUBLICATIONS

Allen, Jr. et al., A Unified Approach to Transform Domain LMS Adaptive Filtering, 1988 IEEE, pp. 424-427.*
(Continued)

*Primary Examiner* — Toan Le
(74) *Attorney, Agent, or Firm* — Studebaker & Brackett PC

(57) ABSTRACT

Filter circuitry is constituted by transversal filters which are connected in parallel to each other. The transversal filters change amplitude and a phase of an input digital signal $X_{in}[n \cdot T_s]$ and output different digital signals $X_1[n \cdot T_s]$, $X_2[n \cdot T_s]$, and $X_3[n \cdot T_s]$ as respective resulting digital signals whose amplitude and phase have been changed. A phase frequency computer computes a phase $\theta_X[n \cdot T_s]$ and a frequency $f_X[n \cdot T_s]$ of the input digital signal $X_{in}[n \cdot T_s]$ by performing phase computation and frequency computation using the digital signals $X_1[n \cdot T_s]$, $X_2[n \cdot T_s]$, and $X_3[n \cdot T_s]$ output by the transversal filters.

9 Claims, 13 Drawing Sheets

(56) References Cited

FOREIGN PATENT DOCUMENTS

| | | |
|---|---|---|
| JP | H106-247245 A | 9/1994 |
| JP | H06-291553 A | 10/1994 |
| JP | 2000-341348 A | 12/2000 |
| JP | 2005-091255 A | 4/2005 |

OTHER PUBLICATIONS

International Search Report issued in PCT/JP2015/056365; dated May 12, 2015.
Written Opinion issued in PCT/JP2015/058365; dated May 12, 2015.

* cited by examiner

First Subtraction-Type First-Order Transversal Filter

Second Subtraction-Type First-Order Transversal Filter

First Addition-Type First-Order Transversal Filter

Second Addition-Type First-Order Transversal Filter

PHASE FREQUENCY DETECTION DEVICE

TECHNICAL FIELD

The invention relates to a phase frequency detection device that is mounted on, for example, a signal measuring device, etc., and that detects a phase and a frequency of an input digital signal.

BACKGROUND ART

A phase frequency detection device disclosed in Patent Literature 1 mentioned later is constituted by A/D conversion circuitry, a digital BPF, delay compensation circuitry, Hilbert transformation circuitry, phase angle computation circuitry, a memory, and frequency computation circuitry.

The A/D conversion circuitry converts an input analog signal into a digital signal and outputs the digital signal to the digital BPF.

The digital BPF outputs only a digital signal in a desired frequency band among digital signals output by the A/D conversion circuitry to the delay compensation circuitry and the Hilbert transformation circuitry.

After receiving the digital signal of the desired frequency band from the digital BPF, the delay compensation circuitry performs a time-shift of the digital signal by a time corresponding to a delay time caused by a Hilbert transformation in the Hilbert transformation circuitry.

After receiving the digital signal of the desired frequency band from the digital BPF, the Hilbert transformation circuitry performs a Hilbert transformation on the digital signal, and thereby outputs a signal differing from the digital signal in a phase by 90 degrees.

Note that the higher the accuracy required for the amplitude and phase of an output signal from the Hilbert transformation circuitry, the longer the delay time resulting from a Hilbert transformation. Therefore, the number of stages of delay circuitry included in the delay compensation circuitry increases, resulting in several tens to hundreds of stages.

The phase angle computation circuitry computes a phase of the input analog signal by performing an arctangent computation based on the output signal of the delay compensation circuitry and the output signal of the Hilbert transformation circuitry, and outputs the resulting phase to the memory and the frequency computation circuitry.

The frequency computation circuitry computes a frequency of the input analog signal by using the phase output by the phase angle computation circuitry and a phase obtained at one sampling time before, which has been stored in the memory.

CITATION LIST

Patent Literature 1: JP 2005-91255 A (e.g., paragraph [0008] and FIG. 1)

SUMMARY OF INVENTION

Since the conventional phase frequency detection device is constituted in the above-described manner, the higher the accuracy required for the amplitude and phase of an output signal from the Hilbert transformation circuitry, the longer the delay time resulting from a Hilbert transformation, resulting in increase in the number of stages of delay circuitry of the delay compensation circuitry. Hence, in a case where a signal to be input is a short-pulse signal, there may cause a problem that the phase and the frequency of the input signal are hard to be detected. In addition, there may be another problem that, as the number of stages of delay circuitry increases, the circuitry size increases and also the power consumption resulting from digital computation increases.

The invention is made to solve problems described above. An object of the invention is to obtain a phase frequency detection device that is capable of detecting a phase and a frequency even if a signal to be input is a short-pulse signal, and also capable of suppressing increase in circuitry size and increase in power consumption caused by increase in the number of stages of delay circuitry.

A phase frequency detection device according to the invention includes: filter circuitry including a plurality of transversal filters which are connected in parallel to each other, the plurality of transversal filters changing amplitude and a phase of an input digital signal and outputting different digital signals as respective resulting digital signals whose amplitude and phase have been changed; and a phase frequency computer to compute a phase and a frequency of the input digital signal by performing phase computation and frequency computation using the digital signals output by the plurality of transversal filters, wherein the filter circuitry is constituted such that a first transversal filter, a second transversal filter, and a third transversal filter, as the plurality of transversal filters, are connected in parallel to each other, and the phase frequency computer includes: first division computation circuitry to perform a division computation between a digital signal output by the first transversal filter and a digital signal output by the second transversal filter, and to output a first division computation signal being a result of the division computation; second division computation circuitry to perform a division computation between a digital signal output by the third transversal filter and the digital signal output by the second transversal filter, and to output a second division computation signal being a result of the division computation; multiplication computation circuitry to perform a multiplication computation between the first division computation signal output by the first division computation circuitry and the second division computation signal output by the second division computation circuitry, and to output a multiplication computation signal being a result of the multiplication computation; root computation circuitry to perform a root computation on the multiplication computation signal output by the multiplication computation circuitry, and to output a root computation signal being a result of the root computation; phase computation circuitry to compute a phase of the input digital signal by using the root computation signal output by the root computation circuitry and a sign of the first division computation signal or the second division computation signal; and frequency computation circuitry to compute a frequency of the input digital signal by using the phase computed by the phase computation circuitry.

According to the invention, it is constituted such that filter circuitry including a plurality of transversal filters which are connected in parallel to each other, the plurality of transversal filters changing amplitude and a phase of an input digital signal and outputting different digital signals as respective resulting digital signals whose amplitude and phase have been changed; and a phase frequency computer to compute a phase and a frequency of the input digital signal by performing phase computation and frequency computation using the digital signals output by the plurality of transversal filters. Thus, there are advantageous effects that, even if a digital signal to be input is a short-pulse signal, a phase and a frequency thereof can be detected, and increase in circuitry size and increase in power consumption caused by increase in the number of stages of delay circuitry can be suppressed.

DESCRIPTION OF EMBODIMENTS

In order to describe the invention in more detail, modes for carrying out the invention will be described below with reference to the accompanying drawings.

Embodiment 1

Figure 1:
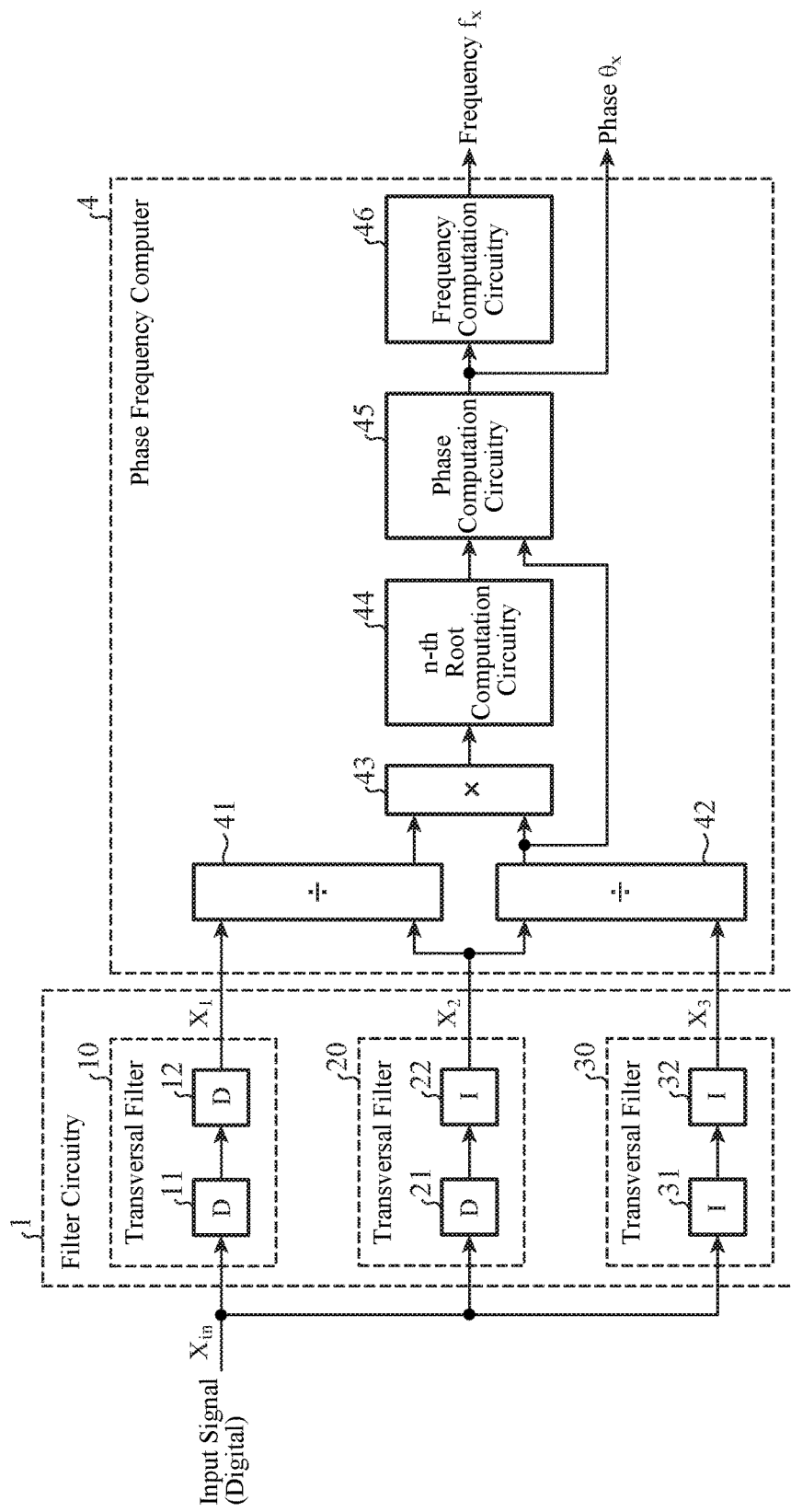
FIG. 1 is a configuration diagram illustrating a phase frequency detection device of Embodiment 1 of the invention.

FIG. 1 is a configuration diagram illustrating a phase frequency detection device of Embodiment 1 of the invention.

In FIG. 1, filter circuitry 1 includes transversal filters 10, 20, and 30, which are connected in parallel to each other. The transversal filters 10, 20, and 30 changes amplitude and a phase of an input digital signal $X_{in}$ and output different digital signals $X_1$, $X_2$, and $X_3$ as respective resulting digital signals whose amplitude and phase have been changed.

The transversal filter 10 as a first transversal filter is constituted by subtraction-type first-order transversal filters 11 and 12 as first subtraction-type first-order transversal filters D, which are connected in series with each other.

The transversal filter 20 as a second transversal filter is constituted such that a subtraction-type first-order transversal filter 21 as a first subtraction-type first-order transversal filter D is connected in series with an addition-type first-order transversal filter 22 as a first addition-type first-order transversal filter I.

The transversal filter 30 as a third transversal filter is constituted by addition-type first-order transversal filters 31 and 32 as first addition-type first-order transversal filters I, which are connected in series with each other.

A phase frequency computer 4 is constituted by division computation circuitries 41 and 42, multiplication computation circuitry 43, n-th root computation circuitry 44, phase computation circuitry 45, and frequency computation circuitry 46. The phase frequency computer 4 performs phase computation and frequency computation that use the digital signals $X_1$, $X_2$, and $X_3$ output by the transversal filters 10, 20, and 30, and thereby computes a phase $\theta_X$ and a frequency $f_X$ of the input digital signal $X_{in}$.

The division computation circuitry 41 is a first division computation circuitry that divides the output digital signal $X_2$ of the transversal filter 20 by the output digital signal $X_1$ of the transversal filter 10, and outputs, to the multiplication computation circuitry 43, a division computation signal $X_2/X_1$ being a result of the division computation as a first division computation signal.

The division computation circuitry 42 is a second division computation circuitry that divides the output digital signal $X_2$ of the transversal filter 20 by the output digital signal $X_3$ of the transversal filter 30, and outputs, to the multiplication computation circuitry 43, a division computation signal $X_2/X_3$ being a result of the division computation as a second division computation signal.

The multiplication computation circuitry 43 performs a multiplication computation between the division computation signal $X_2/X_1$ output by the division computation circuitry 41 and the division computation signal $X_2/X_3$ output by the division computation circuitry 42, and outputs, to the n-th root computation circuitry 44, a multiplication computation signal Y being a result of the multiplication computation.

The n-th root computation circuitry 44 is a root computation circuitry that performs a root computation being an n-th root computation on the absolute value of the multiplication computation signal Y output by the multiplication computation circuitry 43, and outputs, to the phase computation circuitry 45, an n-th root computation signal N being a result of the n-th root computation.

The phase computation circuitry 45 computes a phase $\theta_X$ of the digital signal $X_{in}$ by performing an arctangent computation on the n-th root computation signal output by the n-th root computation circuitry 44, and performing sign conversion on the result of the arctangent computation depending on the sign of the division computation signal $X_2/X_3$ output by the division computation circuitry 42.

Note that the n-th root computation circuitry 44 and the phase computation circuitry 45 may be constituted by, for example, combining a multiplier and a divider, etc. Alternatively, they may be constituted by, for example, a memory or a table that temporarily stores intermediate results of an n-th root computation and an arctangent computation, and a computation circuitry such as a processor performing the above-described computations.

The frequency computation circuitry 46 computes a frequency $f_X$ of the input digital signal $X_{in}$ by using the phase $\theta_X$ computed by the phase computation circuitry 45.

FIGS. 2A to 2D are configuration diagrams illustrating subtraction-type first-order transversal filters and addition-type first-order transversal filters.

Figure 2A:
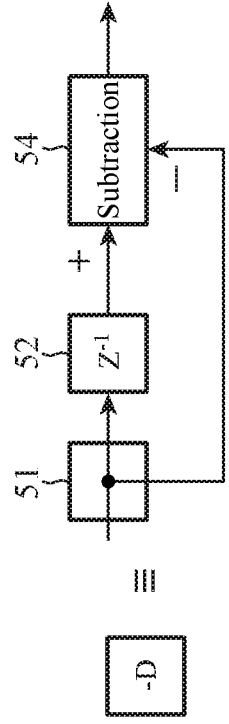
FIG. 2 is a configuration diagram illustrating subtraction-type first-order transversal filters and addition-type first-order transversal filters.
Figure 2B:
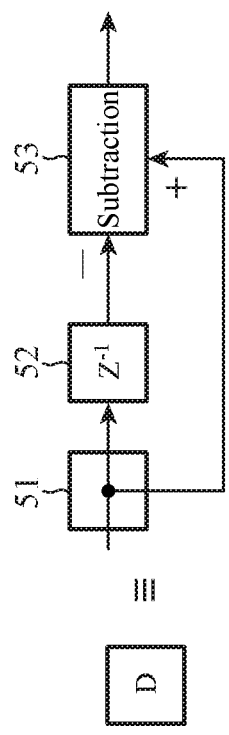

Specifically, FIG. 2A represents a first subtraction-type first-order transversal filter D, and FIG. 2B represents a second subtraction-type first-order transversal filter −D.

Figure 2C:
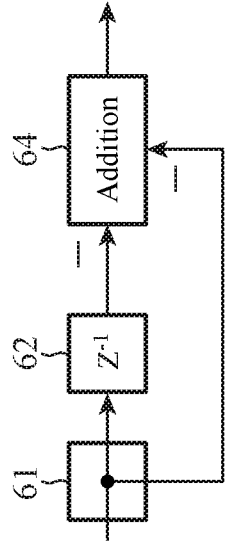
Figure 2D:
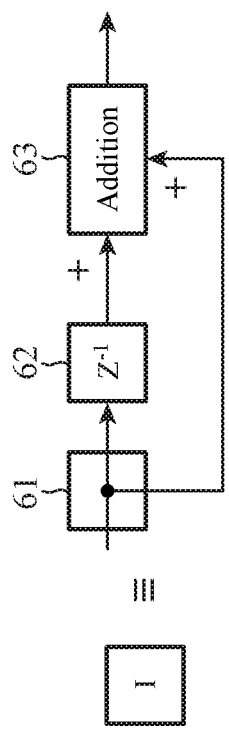

In addition, FIG. 2C represents a first addition-type first-order transversal filter I, and FIG. 2D represents a second addition-type first-order transversal filter −I.

Note that, in the example of FIG. 1, while the first subtraction-type first-order transversal filter D and the first addition-type first-order transversal filter I are used, the second subtraction-type first-order transversal filter −D and the second addition-type first-order transversal filter −I are not used.

The first subtraction-type first-order transversal filter D of FIG. 2A is constituted by splitter circuitry 51, one-sampling time delaying circuitry 52, and subtraction computation circuitry 53.

The splitter circuitry 51 is a first splitter circuitry that splits an input digital signal $X_{in}$ into two.

The one-sampling time delaying circuitry 52 is a first delaying circuitry that delays one digital signal $X_{in}$ split by the splitter circuitry 51 by one sampling time $T_s$ ($=1/f_s$).

The subtraction computation circuitry 53 subtracts the digital signal, which has been delayed by the one-sampling time delaying circuitry 52, from the other digital signal $X_{in}$ split by the splitter circuitry 51.

The second subtraction-type first-order transversal filter −D of FIG. 2B is constituted by splitter circuitry 51, one-sampling time delaying circuitry 52, and subtraction computation circuitry 54.

The subtraction computation circuitry 54 subtracts the other digital signal $X_{in}$ split by the splitter circuitry 51 from a digital signal having been delayed by the one-sampling time delaying circuitry 52.

Note that the difference between the first subtraction-type first-order transversal filter D of FIG. 2A and the second subtraction-type first-order transversal filter −D of FIG. 2B is the sign of an input signal to the subtraction computation circuitries 53 and 54. Accordingly, the sign of an output signal from the first subtraction-type first-order transversal filter D of FIG. 2A is opposite to that of an output signal from the second subtraction-type first-order transversal filter −D of FIG. 2B.

The first addition-type first-order transversal filter I of FIG. 2C is constituted by splitter circuitry 61, one-sampling time delaying circuitry 62, and addition computation circuitry 63.

The splitter circuitry 61 is a second splitter circuitry that splits an input digital signal $X_{in}$ into two.

The one-sampling time delaying circuitry 62 is a second delaying circuitry that delays one digital signal $X_{in}$ split by the splitter circuitry 61 by one sampling time $T_s$.

The addition computation circuitry 63 adds the digital signal delayed by the one-sampling time delaying circuitry 62 to the other digital signal $X_{in}$ split by the splitter circuitry 61.

The second addition-type first-order transversal filter −I of FIG. 2D is constituted by splitter circuitry 61, one-sampling time delaying circuitry 62, and addition computation circuitry 64.

The addition computation circuitry 64 receives a digital signal obtained by reversing a sign of the digital signal having been delayed by the one-sampling time delaying circuitry 62, and also receives a digital signal obtained by reversing a sign of the other digital signal $X_{in}$ split by the splitter circuitry 61. After that, the addition computation circuitry 64 adds the received former digital signal to the received latter digital signal $X_{in}$.

Note that the difference between the first addition-type first-order transversal filter I of FIG. 2C and the second addition-type first-order transversal filter −I of FIG. 2D is the sign of signals input to the addition computation circuitries 63 and 64. Accordingly, the sign of an output signal from the first addition-type first-order transversal filter I of FIG. 2C is opposite to that of an output signal from the second addition-type first-order transversal filter −I of FIG. 2D.

Next, operation will be described.

It is assumed that a digital signal $X_{in}[n \cdot T_s]$ is input to the transversal filters 10, 20, and 30 of the filter circuitry 1 at a discrete time $n \cdot T_s$.

The following equation (1) represents the time waveform of the digital signal $X_{in}[n \cdot T_s]$.

$$X_{in}[n \cdot T_s] = \alpha \cdot \cos(\Delta\theta + \Sigma\theta_{n-1}) \tag{1}$$

In the equation (1), $\alpha$ is the amplitude factor of $X_{in}$, $\Delta\theta$ is the amount of change in phase during one sampling time, and $\Sigma\theta_{n-1}$ is an integrated value of phases at discrete-times from zero to n−1.

In the transversal filter 10, the subtraction-type first-order transversal filters 11 and 12 being the first subtraction-type first-order transversal filter D shown in FIG. 2A are connected in series with each other. Thus, by receiving a digital signal $X_{in}[n \cdot T_s]$, the transversal filter 10 changes amplitude and a phase of the digital signal $X_{in}[n \cdot T_s]$, and outputs, to the phase frequency computer 4, a resulting digital signal $X_1[n \cdot T_s]$ whose amplitude and phase have been changed.

Specifically, by receiving a digital signal $X_{in}[n \cdot T_s]$, the subtraction-type first-order transversal filter 11 of the transversal filter 10 outputs, to the subtraction-type first-order transversal filter 12, a digital signal $X_1'[n \cdot T_s]$ obtained by the following equation (2).

$$\begin{aligned}X_1'[n \cdot T_s] &= X_{in}[n \cdot T_s] - X_{in}[(n-1) \cdot T_s] \\ &= \alpha \cdot \cos(\Delta\theta + \Sigma\theta_{n-1}) - \alpha \cdot \cos(\Delta\theta + \Sigma\theta_{n-2}) \\ &= \alpha \cdot \cos(2 \cdot \Delta\theta + \Sigma\theta_{n-2}) - \alpha \cdot \cos(\Delta\theta + \Sigma\theta_{n-2}) \\ &= -2 \cdot \alpha \cdot \sin(0.5 \cdot \Delta\theta) \cdot \sin(1.5 \cdot \Delta\theta + \Sigma\theta_{n-2})\end{aligned} \tag{2}$$

The subtraction-type first-order transversal filter 12 of the transversal filter 10 receives the digital signal $X_1'[n \cdot T_s]$ from the subtraction-type first-order transversal filter 11, and outputs, to the phase frequency computer 4, a digital signal $X_1[n \cdot T_s]$ obtained by the following equation (3).

$$\begin{aligned}X_1[n \cdot T_s] &= X_1'[n \cdot T_s] - X_1'[(n-1) \cdot T_s] \\ &= -2 \cdot \alpha \cdot \sin(0.5 \cdot \Delta\theta) \cdot \sin(1.5 \cdot \Delta\theta + \Sigma\theta_{n-2}) + \\ &\quad 2 \cdot \alpha \cdot \sin(0.5 \cdot \Delta\theta) \cdot \sin(0.5 \cdot \Delta\theta + \Sigma\theta_{n-2}) \\ &= -2 \cdot \alpha \cdot \sin(0.5 \cdot \Delta\theta) \cdot [\sin(1.5 \cdot \Delta\theta + \Sigma\theta_{n-2}) - \\ &\quad \sin(0.5 \cdot \Delta\theta + \Sigma\theta_{n-2})] \\ &= -2 \cdot \alpha \cdot \sin(0.5 \cdot \Delta\theta) \cdot [2 \cdot \sin(0.5 \cdot \Delta\theta) \cdot \cos(\Delta\theta + \Sigma\theta_{n-2})] \\ &= -4 \cdot \alpha \cdot \sin(0.5 \cdot \Delta\theta) \cdot \sin(0.5 \cdot \Delta\theta) \cdot \cos(\Delta\theta + \Sigma\theta_{n-2})\end{aligned} \tag{3}$$

In the transversal filter 20, the subtraction-type first-order transversal filter 21 being the first subtraction-type first-order transversal filter D shown in FIG. 2A is connected in series with the addition-type first-order transversal filter 22 being the first addition-type first-order transversal filter I shown in FIG. 2C. Thus, by receiving a digital signal $X_{in}[n \cdot T_s]$, the transversal filter 20 changes amplitude and a phase of the digital signal $X_{in}[n \cdot T_s]$, and outputs, to the phase frequency computer 4, a resulting digital signal $X_2[n \cdot T_s]$ whose amplitude and phase have been changed.

Specifically, by receiving a digital signal $X_{in}[n \cdot T_s]$, the subtraction-type first-order transversal filter 21 of the transversal filter 20 outputs, to the addition-type first-order transversal filter 22, a digital signal $X_2'[n \cdot T_s]$ obtained by the following equation (4).

$$X_2'[n \cdot T_s] = X_{in}[n \cdot T_s] - X_{in}[(n-1) \cdot T_s] \qquad (4)$$
$$= \alpha \cdot \cos(\Delta\theta + \Sigma\theta_{n-1}) - \alpha \cdot \cos(\Delta\theta + \Sigma\theta_{n-2})$$
$$= \alpha \cdot \cos(2 \cdot \Delta\theta + \Sigma\theta_{n-2}) - \alpha \cdot \cos(\Delta\theta + \Sigma\theta_{n-2})$$
$$= -2 \cdot \alpha \cdot \sin(0.5 \cdot \Delta\theta) \cdot \sin(1.5 \cdot \Delta\theta + \Sigma\theta_{n-2})$$

The addition-type first-order transversal filter 22 of the transversal filter 20 receives the digital signal $X_2'[n \cdot T_s]$ from the subtraction-type first-order transversal filter 21, and outputs, to the phase frequency computer 4, a digital signal $X_2[n \cdot T_s]$ obtained by the following equation (5).

$$X_2[n \cdot T_s] = X_2'[n \cdot T_s] - X_2'[(n-1) \cdot T_s] \qquad (5)$$
$$= -2 \cdot \alpha \cdot \sin(0.5 \cdot \Delta\theta) \cdot \sin(1.5 \cdot \Delta\theta + \Sigma\theta_{n-2}) -$$
$$2 \cdot \alpha \cdot \sin(0.5 \cdot \Delta\theta) \cdot \sin(0.5 \cdot \Delta\theta + \Sigma\theta_{n-2})$$
$$= -2 \cdot \alpha \cdot \sin(0.5 \cdot \Delta\theta) \cdot [\sin(1.5 \cdot \Delta\theta + \Sigma\theta_{n-2}) +$$
$$\sin(0.5 \cdot \Delta\theta + \Sigma\theta_{n-2})]$$
$$= -2 \cdot \alpha \cdot \sin(0.5 \cdot \Delta\theta) \cdot [2 \cdot \cos(0.5 \cdot \Delta\theta) \cdot \sin(\Delta\theta + \Sigma\theta_{n-2})]$$
$$= -4 \cdot \alpha \cdot \sin(0.5 \cdot \Delta\theta) \cdot \cos(0.5 \cdot \Delta\theta) \cdot \sin(\Delta\theta + \Sigma\theta_{n-2})$$

In the transversal filter 30, the addition-type first-order transversal filters 31 and 32 being the first addition-type first-order transversal filter I shown in FIG. 2C are connected in series with each other. Thus, by receiving a digital signal $X_{in}[n \cdot T_s]$, the transversal filter 30 changes amplitude and a phase of the digital signal $X_{in}[n \cdot T_s]$ and outputs, to the phase frequency computer 4, a resulting digital signal $X_3[n \cdot T_s]$ whose amplitude and phase have been changed.

Specifically, by receiving a digital signal $X_{in}[n \cdot T_s]$, the addition-type first-order transversal filter 31 of the transversal filter 30 outputs, to the addition-type first-order transversal filter 32, a digital signal $X_3'[n \cdot T_s]$ obtained by the following equation (6).

$$X_3'[n \cdot T_s] = X_{in}[n \cdot T_s] + X_{in}[(n-1) \cdot T_s] \qquad (6)$$
$$= \alpha \cdot \cos(\Delta\theta + \Sigma\theta_{n-1}) + \alpha \cdot \cos(\Delta\theta + \Sigma\theta_{n-2})$$
$$= \alpha \cdot \cos(2 \cdot \Delta\theta + \Sigma\theta_{n-2}) + \alpha \cdot \cos(\Delta\theta + \Sigma\theta_{n-2})$$
$$= 2 \cdot \alpha \cdot \cos(0.5 \cdot \Delta\theta) \cdot \cos(1.5 \cdot \Delta\theta + \Sigma\theta_{n-2})$$

The addition-type first-order transversal filter 32 of the transversal filter 30 receives the digital signal $X_3'[n \cdot T_s]$ from the addition-type first-order transversal filter 31, and outputs, to the phase frequency computer 4, a digital signal $X_3[n \cdot T_s]$ obtained by the following equation (7).

$$X_3[n \cdot T_s] = X_3'[n \cdot T_s] + X_3'[(n-1) \cdot T_s] \qquad (7)$$
$$= 2 \cdot \alpha \cdot \cos(0.5 \cdot \Delta\theta) \cdot \cos(1.5 \cdot \Delta\theta + \Sigma\theta_{n-2}) +$$
$$2 \cdot \alpha \cdot \cos(0.5 \cdot \Delta\theta) \cdot \cos(0.5 \cdot \Delta\theta + \Sigma\theta_{n-2})$$
$$= 2 \cdot \alpha \cdot \cos(0.5 \cdot \Delta\theta) \cdot [\cos(1.5 \cdot \Delta\theta + \Sigma\theta_{n-2}) +$$
$$\cos(0.5 \cdot \Delta\theta + \Sigma\theta_{n-2})]$$
$$= 4 \cdot \alpha \cdot \cos(0.5 \cdot \Delta\theta) \cdot \cos(0.5 \cdot \Delta\theta) \cdot \cos(\Delta\theta + \Sigma\theta_{n-2})$$

The phase frequency computer 4 receives the digital signals $X_1[n \cdot T_s]$, $X_2[n \cdot T_s]$, and $X_3[n \cdot T_s]$ from the transversal filters 10, 20, and 30, and computes a phase $\theta_X[n \cdot T_s]$ and a frequency $f_X[n \cdot T_s]$ of the input digital signal $X_{in}$ by performing phase computation and frequency computation using the received digital signals $X_1[n \cdot T_s]$, $X_2[n \cdot T_s]$, and $X_3[n \cdot T_s]$.

Specifically, by receiving the digital signals $X_1[n \cdot T_s]$ and $X_2[n \cdot T_s]$ from the transversal filters 10 and 20, the division computation circuitry 41 divides the digital signal $X_2[n \cdot T_s]$ by the digital signal $X_1[n \cdot T_s]$, as shown in the following equation (8), and outputs, to the multiplication computation circuitry 43, a division computation signal $X_2[n \cdot T_s]/X_1[n \cdot T_s]$ being the result of the division computation.

$$\frac{X_2[n \cdot T_s]}{X_1[n \cdot T_s]} = [-4 \cdot \alpha \cdot \sin(0.5 \cdot \Delta\theta) \cdot \cos(0.5 \cdot \Delta\theta) \cdot \sin(\Delta\theta + \Sigma\theta_{n-2})] / \qquad (8)$$
$$[-4 \cdot \alpha \cdot \sin(0.5 \cdot \Delta\theta) \cdot \sin(0.5 \cdot \Delta\theta) \cdot \cos(\Delta\theta + \Sigma\theta_{n-2})]$$
$$= \cot(0.5 \cdot \Delta\theta) \cdot \tan(\Delta\theta + \Sigma\theta_{n-2})$$

By receiving the digital signals $X_2[n \cdot T_s]$ and $X_3[n \cdot T_s]$ from the transversal filters 20 and 30, the division computation circuitry 42 divides the digital signal $X_2[n \cdot T_s]$ by the digital signal $X_3[n \cdot T_s]$, as shown in the following equation (9), and outputs, to the multiplication computation circuitry 43, a division computation signal $X_2[n \cdot T_s]/X_3[n \cdot T_s]$ being the result of the division computation.

$$\frac{X_2[n \cdot T_s]}{X_3[n \cdot T_s]} = [-4 \cdot \alpha \cdot \sin(0.5 \cdot \Delta\theta) \cdot \cos(0.5 \cdot \Delta\theta) \cdot \sin(\Delta\theta + \Sigma\theta_{n-2})] / \qquad (9)$$
$$[4 \cdot \alpha \cdot \cos(0.5 \cdot \Delta\theta) \cdot \cos(0.5 \cdot \Delta\theta) \cdot \cos(\Delta\theta + \Sigma\theta_{n-2})]$$
$$= -\tan(0.5 \cdot \Delta\theta) \cdot \tan(\Delta\theta + \Sigma\theta_{n-2})$$

The multiplication computation circuitry 43 receives the division computation signals $X_2[n \cdot T_s]/X_1[n \cdot T_s]$ and $X_2[n \cdot T_s]/X_3[n \cdot T_s]$ output by the division computation circuitries 41 and 42. The multiplication computation circuitry 43 multiplies the division computation signal $X_2[n \cdot T_s]/X_1[n \cdot T_s]$ by the division computation signal $X_2[n \cdot T_s]/X_3[n \cdot T_s]$, as shown in the following equation (10), and outputs, to the n-th root computation circuitry 44, a multiplication computation signal $Y[n \cdot T_s]$ being the result of the multiplication computation.

$$Y[n \cdot T_s] = (X_2[n \cdot T_s]/X_1[n \cdot T_s]) \cdot (X_2[n \cdot T_s]/X_3[n \cdot T_s]) \quad (10)$$

$$= -\tan^2(\Delta\theta + \Sigma\theta_{n-2})$$

The n-th root computation circuitry 44 receives the multiplication computation signal $Y[n \cdot T_s]$ from the multiplication computation circuitry 43. The n-th root computation circuitry 44 performs an n-th root computation on the absolute value of the received multiplication computation signal $Y[n \cdot T_s]$, and outputs, to the phase computation circuitry 45, an n-th root computation signal $N[n \cdot T_s]$ being the result of the n-th root computation.

$$N[n \cdot T_s] = \tan(\Delta\theta + \Sigma\theta_{n-2}) \quad (11)$$

Here, since n for the n-th root computation is 0.5, $N[n \cdot T_s]$ is $[|Y[n \cdot T_s]|]^{0.5}$.

After receiving the n-th root computation signal $N[n \cdot T_s]$ from the n-th root computation circuitry 44, the phase computation circuitry 45 performs an arctangent computation on the n-th root computation signal $N[n \cdot T_s]$ according to following equation (12). The phase computation circuitry 45 further performs sign conversion on the result of the arctangent computation depending on the sign of the division computation signal $X_2[n \cdot T_s]/X_3[n \cdot T_s]$ output by the division computation circuitry 42, and thereby computes a phase $\theta_X[n \cdot T_s]$ of the digital signal $X_{in}$.

Specifically, when the sign of the division computation signal $X_2[n \cdot T_s]/X_3[n \cdot T_s]$ is positive, the sign of the phase $\theta_X[n \cdot T_s]$ of the digital signal $X_{in}$ is also positive, and when the sign of the division computation signal $X_2[n \cdot T_s]/X_3[n \cdot T_s]$ is negative, the sign of the phase $\theta_X[n \cdot T_s]$ of the digital signal $X_{in}$ is also negative.

$$\theta_X[n \cdot T_s] = \tan^{-1}(|N[n \cdot T_s]|) \quad (12)$$

$$= -\tan^1(|\tan(\Delta\theta + \Sigma\theta_{n-2})|)$$

The example is disclosed here, in which the phase computation circuitry 45 performs sign conversion on the result of the arctangent computation depending on the sign of the division computation signal $X_2[n \cdot T_s]/X_3[n \cdot T_s]$ output by the division computation circuitry 42. Alternatively, the phase computation circuitry 45 may perform sign conversion on the result of the arctangent computation depending on the sign of the division computation signal $X_2[n \cdot T_s]/X_1[n \cdot T_s]$ output by the division computation circuitry 41.

When the transversal filters 10, 20, and 30 in the filter circuitry 1 have the configurations shown in FIG. 1, the sign of the division computation signal $X_2[n \cdot T_s]/X_1[n \cdot T_s]$ output by the division computation circuitry 41 is the same as that of the division computation signal $X_2[n \cdot T_s]/X_3[n \cdot T_s]$ output by the division computation circuitry 42.

After the phase $\theta_X[n \cdot T_s]$ of the digital signal $X_{in}$ is computed by the phase computation circuitry 45, the frequency computation circuitry 46 computes a frequency $f_X[n \cdot T_s]$ of the input digital signal $X_{in}$ by using the phase $\theta_X[n \cdot T_s]$ of the digital signal $X_{in}$, as shown in the following equation (13).

$$f_X[n \cdot T_s] = \{\theta_X[n \cdot T_s] - \theta_X[(n-1) \cdot T_s]\} \cdot f_s/(2\pi) \quad (13)$$

In the Embodiment 1, the phase frequency computer 4 is able to obtain by the equations (12) and (13) the phase $\theta_X[n \cdot T_s]$ and frequency $f_X[n \cdot T_s]$ of the digital signal $X_{in}$ without performing a Hilbert transformation.

In addition, since the number of stages of delay circuitry used by the transversal filters 10, 20, and 30 is two, the delay time resulting from detection is as short as two sampling times and thus a short-pulse input signal can be detected.

The Embodiment 1 represents that the division computation circuitry 41 computes a division computation signal $X_2[n \cdot T_s]/X_1[n \cdot T_s]$ and the division computation circuitry 42 computes a division computation signal $X_2[n \cdot T_s]/X_3[n \cdot T_s]$. Alternatively, the division computation circuitry 41 may compute a division computation signal $X_1[n \cdot T_s]/X_2[n \cdot T_s]$ and the division computation circuitry 42 may compute a division computation signal $X_3[n \cdot T_s]/X_2[n \cdot T_s]$.

In this case, an n-th root computation signal $N[n \cdot T_s] = [|Y[n \cdot T_s]|]^{0.5}$ output by the n-th root computation circuitry 44 is given by the following equation (14).

$$N[n \cdot T_s] = [|Y[n \cdot T_s]|]^{0.5} \quad (14)$$

$$= \cot(\Delta\theta + \Sigma\theta_{n-2})$$

Here, in accordance with the mathematical formula "$\cot^{-1}(X) = -\tan^{-1}(X) + \pi/2$", an arctangent computation is performed on a value obtained by the equation (14), and $\pi/2$ is added to the result of the arctangent computation whose sign is reversed. As a result, the phase $\theta_X[n \cdot T_s]$ of the digital signal $X_{in}$ has the same value as that obtained in equation (12).

As is clear from the above description, according to the Embodiment 1, it is constituted such that the filter circuitry 1 including the transversal filters 10, 20, and 30 connected in parallel to each other is provided, the transversal filters 10, 20, and 30 changing the amplitude and phase of an input digital signal $X_{in}[n \cdot T_s]$ and outputting different digital signals $X_1[n \cdot T_s]$, $X_2[n \cdot T_s]$, and $X_3[n \cdot T_s]$ as respective resulting digital signals whose amplitude and phase have been changed; and the phase frequency computer 4 performs phase computation and frequency computation that use the digital signals $X_1[n \cdot T_s]$, $X_2[n \cdot T_s]$, and $X_3[n \cdot T_s]$ output by the transversal filters 10, 20, and 30, and thereby computes the phase $\theta_X[n \cdot T_s]$ and frequency $f_X[n \cdot T_s]$ of the input digital signal $X_{in}[n \cdot T_s]$. Thus, advantageous effects are achieved such that, even if a digital signal $X_{in}[n \cdot T_s]$ to be input is a short-pulse signal, a phase $\theta_X[n \cdot T_s]$ and a frequency $f_X[n \cdot T_s]$ can be detected, and increase in circuitry size and increase in power consumption, which may be caused by increase in the number of stages of delay circuitry, can be suppressed.

The Embodiment 1 represents an example, in which in the transversal filter 10 the subtraction-type first-order transversal filters 11 and 12 being the first subtraction-type first-order transversal filter D shown in FIG. 2A are connected in series with each other, in the transversal filter 20 the subtraction-type first-order transversal filter 21 being the first subtraction-type first-order transversal filter D shown in FIG. 2A is connected in series with the addition-type first-order transversal filter 22 being the first addition-type first-order transversal filter I shown in FIG. 2C, and in the transversal filter 30 the addition-type first-order transversal filters 31 and 32 being the first addition-type first-order transversal filter I shown in FIG. 2C are connected in series with each other.

Note, however, that this is simply one example. The transversal filters 10, 20, and 30 may have any combination of types of first-order transversal filters to be used.

For example, while the second subtraction-type first-order transversal filter −D shown in FIG. 2B may be used as the subtraction-type first-order transversal filters 11, 12, and 21, the second addition-type first-order transversal filter −I shown in FIG. 2D may be used as the addition-type first-order transversal filters 22, 31, and 32, and thereby the same advantageous effects can be achieved.

Note that the result of sign conversion performed by the phase computation circuitry 45 is reversed depending on the combination of first-order transversal filters to be used.

Embodiment 2

The above-described Embodiment 1 represents that the phase frequency computer 4 performs a multiplication computation by the multiplication computation circuitry 43 after performing a division computation by each of the division computation circuitries 41 and 42. However, the phase frequency computer 4 may perform a division computation after a multiplication computation.

Figure 3:
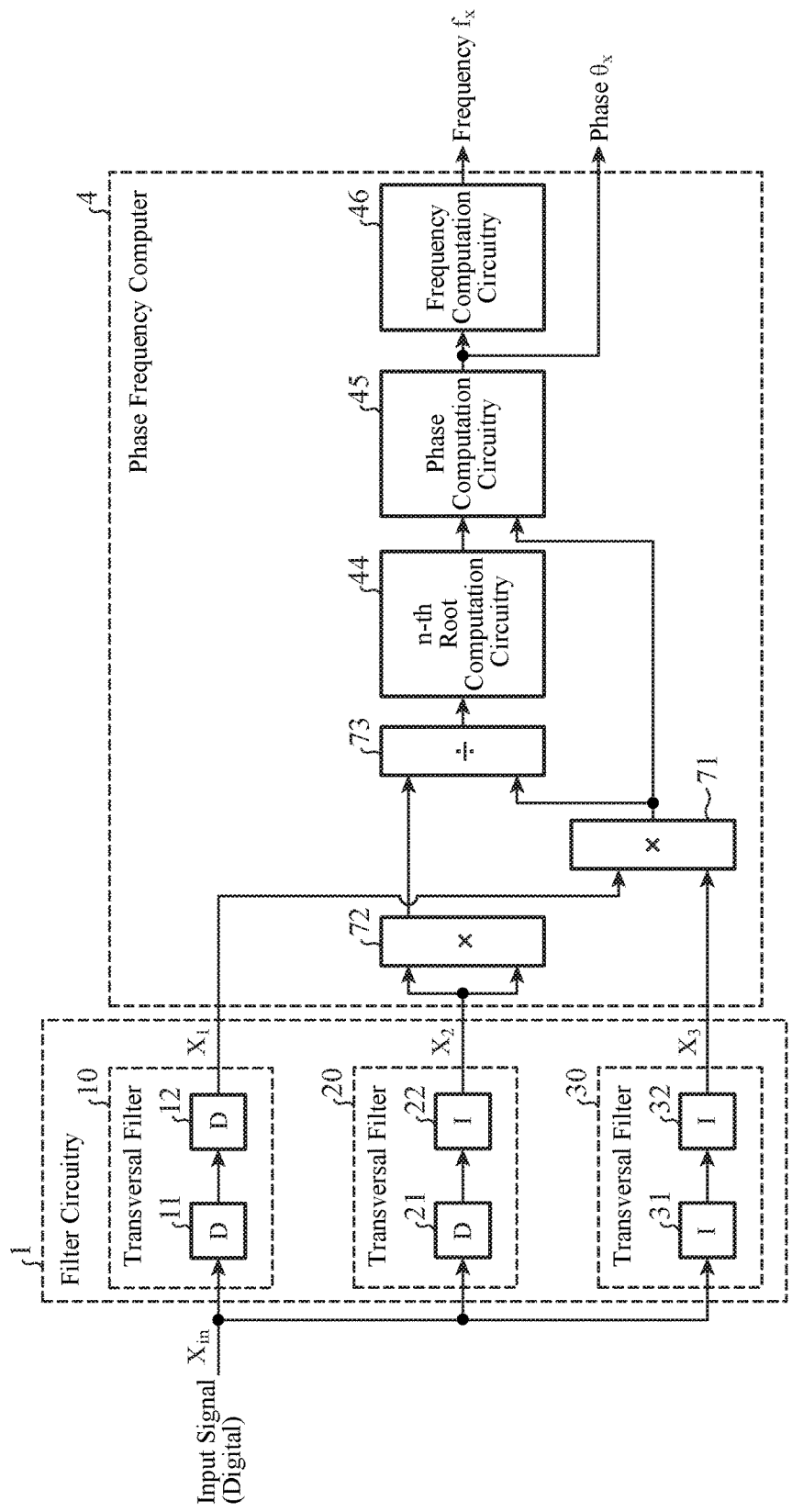
FIG. 3 is a configuration diagram illustrating a phase frequency detection device of Embodiment 2 of the invention.

FIG. 3 is a configuration diagram illustrating a phase frequency detection device of Embodiment 2 of the invention. In FIG. 3, the same reference signs as those in FIG. 1 indicate the same or corresponding portions and thus description thereof is omitted.

Multiplication computation circuitry 71 is first multiplication computation circuitry that performs a multiplication computation between a digital signal $X_1[n \cdot T_s]$ output by a transversal filter 10 and a digital signal $X_3[n \cdot T_s]$ output by a transversal filter 30, and outputs a resulting signal $X_1[n \cdot T_s] \cdot X_3[n \cdot T_s]$ of the multiplication computation as a first multiplication computation signal.

Multiplication computation circuitry 72 is second multiplication computation circuitry that performs a square multiplication on a digital signal $X_2[n \cdot T_s]$ output by a transversal filter 20 and outputs the resulting signal $X_2[n \cdot T_s] \cdot X_2[n \cdot T_s]$ of the square multiplication as a second multiplication computation signal.

Division computation circuitry 73 divides the resulting signal $X_2[n \cdot T_s] \cdot X_2[n \cdot T_s]$ of the square multiplication coming from the multiplication computation circuitry 72 by the resulting signal $X_1[n \cdot T_s] \cdot X_3[n \cdot T_s]$ of the multiplication computation coming from the multiplication computation circuitry 71. After that, the computation circuitry 73 outputs a resulting signal $(X_2[n \cdot T_s] \cdot X_2[n \cdot T_s])/(X_1[n \cdot T_s] \cdot X_3[n \cdot T_s])$ of the division computation as a division computation signal to an n-th root computation circuitry 44.

As shown in FIG. 3, even when the phase frequency computer 4 performs a division computation by the division computation circuitry 73 after performing a multiplication computation by each of the multiplication computation circuitries 71 and 72, the same value as that shown in equation (10) is output to the n-th root computation circuitry 44. Thus, the same advantageous effects as those in the above-described Embodiment 1 can be achieved.

Embodiment 3

The above-described Embodiment 1 represents that the filter circuitry 1 is constituted by the three transversal filters 10, 20, and 30, which are connected in parallel to each other. Alternatively, the filter circuitry may be constituted by two transversal filters 10 and 30, which are connected in parallel to each other.

Figure 4:
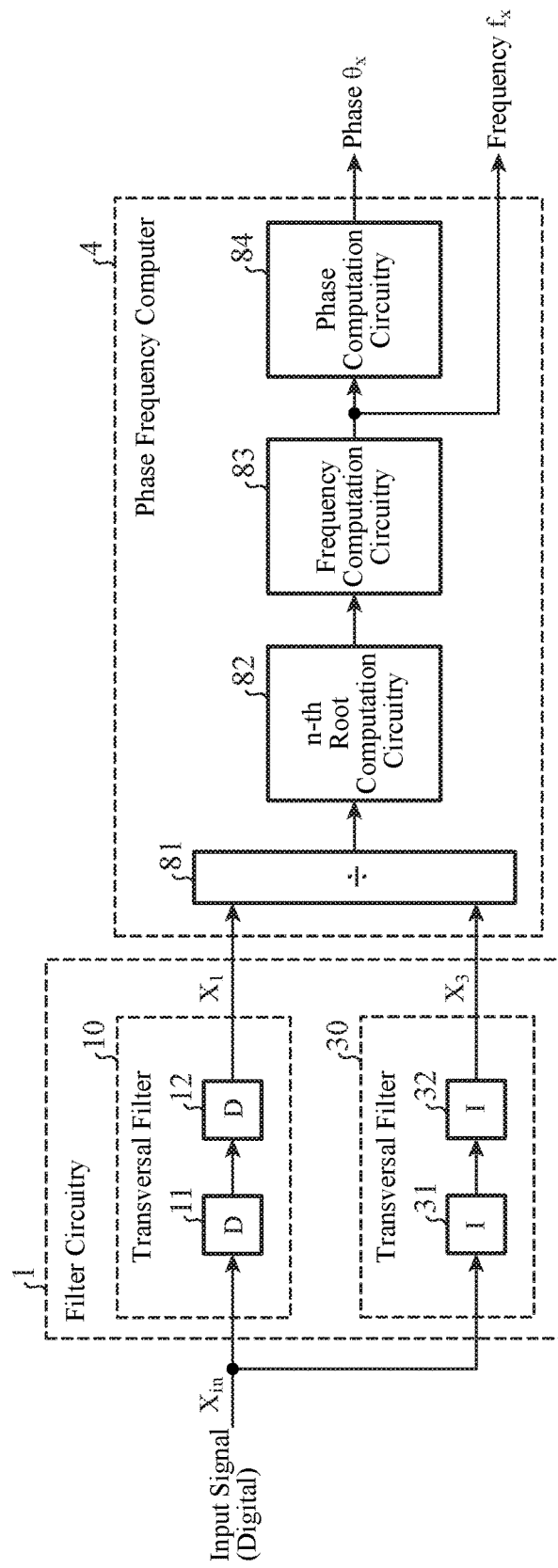
FIG. 4 is a configuration diagram illustrating a phase frequency detection device of Embodiment 3 of the invention.

FIG. 4 is a configuration diagram illustrating a phase frequency detection device of Embodiment 3 of the invention. In FIG. 4, the same reference signs as those in FIG. 1 indicate the same or corresponding portions and thus description thereof is omitted.

In the Embodiment 3, a transversal filter 10 serves as a first transversal filter, and a transversal filter 30 serves as a second transversal filter.

Division computation circuitry 81 divides a digital signal $X_1$ coming from the transversal filter 10 by a digital signal $X_3$ coming from the transversal filter 30, and outputs, to n-th root computation circuitry 82, a division computation signal $X_1/X_3$ being the result of the division computation.

The n-th root computation circuitry 82 is root computation circuitry that performs an n-th root computation on the absolute value of the division computation signal $X_1/X_3$ output by the division computation circuitry 81, and outputs, to frequency computation circuitry 83, an n-th root computation signal N being the result of the n-th root computation.

The frequency computation circuitry 83 computes a frequency $f_X$ of an input digital signal $X_{in}$ by using the n-th root computation signal N output by the n-th root computation circuitry 82.

Phase computation circuitry 84 computes a phase $\theta_X$ of the input digital signal $X_{in}$ by using the frequency $f_X$ computed by the frequency computation circuitry 83.

Next, operation will be described.

It is assumed that a digital signal $X_{in}[n \cdot T_s]$ is input to the transversal filters 10 and 30 in the filter circuitry 1 at discrete time $n \cdot T_s$ in the same manner as the above-described Embodiment 1.

In the transversal filter 10, the subtraction-type first-order transversal filters 11 and 12, each of which is the first subtraction-type first-order transversal filter D shown in FIG. 2A, are connected in series with each other. Thus, by inputting a digital signal $X_{in}[n \cdot T_s]$ to the transversal filter 10, the transversal filter 10 changes the amplitude and phase of the digital signal $X_{in}[n \cdot T_s]$ and outputs, to a phase frequency computer 4, a resulting digital signal $X_1[n \cdot T_s]$ whose amplitude and phase have been changed.

Specifically, after receiving the digital signal $X_{in}[n \cdot T_s]$, the subtraction-type first-order transversal filter 11 of the transversal filter 10 outputs a digital signal $X_1'[n \cdot T_s]$ according to the above-described equation (2) to the subtraction-type first-order transversal filter 12.

The subtraction-type first-order transversal filter 12 of the transversal filter 10 receives the digital signal $X_1'[n \cdot T_s]$ coming from the subtraction-type first-order transversal filter 11 and outputs a digital signal $X_1[n \cdot T_s]$ according to the above-described equation (3) to the phase frequency computer 4.

In the transversal filter 30, the addition-type first-order transversal filters 31 and 32, each of which are the first addition-type first-order transversal filter I shown in FIG. 2C, are connected in series with each other. Thus, by inputting a digital signal $X_{in}[n \cdot T_s]$ to the transversal filter 30, the transversal filter 30 changes the amplitude and phase of the digital signal $X_{in}[n \cdot T_s]$ and outputs, to the phase frequency computer 4, a resulting digital signal $X_3[n \cdot T_s]$ whose amplitude and phase have been changed.

Specifically, after receiving the digital signal $X_{in}[n \cdot T_s]$, the addition-type first-order transversal filter 31 of the transversal filter 30 outputs a digital signal $X_3'[n \cdot T_s]$ according to the above-described equation (6) to the addition-type first-order transversal filter 32.

The addition-type first-order transversal filter 32 of the transversal filter 30 receives the digital signal $X_3'[n \cdot T_s]$ coming from the addition-type first-order transversal filter 31 and outputs a digital signal $X_3[n \cdot T_s]$ according to the above-described equation (7) to the phase frequency computer 4.

After receiving the digital signals $X_1[n \cdot T_s]$ and $X_3[n \cdot T_s]$ coming from the transversal filters 10 and 30, the phase frequency computer 4 performs phase computation and frequency computation using the digital signals $X_1[n \cdot T_s]$ and $X_3[n \cdot T_s]$, and thereby computes a phase $\theta_X[n \cdot T_s]$ and a frequency $f_X[n \cdot T_s]$ of the input digital signal $X_{in}$.

Specifically, by receiving the digital signals $X_1[n \cdot T_s]$ and $X_3[n \cdot T_s]$ from the transversal filters 10 and 30, the division computation circuitry 81 of the phase frequency computer 4 divides, as shown in the following equation (15), the digital signal $X_1[n \cdot T_s]$ by the digital signal $X_3[n \cdot T_s]$ and outputs to the n-th root computation circuitry 82 a division computation signal $X_1[n \cdot T_s]/X_3[n \cdot T_s]$ being the result of the division computation.

$$\frac{X_1[n \cdot T_s]}{X_3[n \cdot T_s]} = [-4 \cdot \alpha \cdot \sin(0.5 \cdot \Delta\theta) \cdot \sin(0.5 \cdot \Delta\theta) \cdot \cos(\Delta\theta + \Sigma\theta_{n-2})] / \quad (15)$$
$$[4 \cdot \alpha \cdot \cos(0.5 \cdot \Delta\theta) \cdot \cos(0.5 \cdot \Delta\theta) \cdot \cos(\Delta\theta + \Sigma\theta_{n-2})]$$
$$= -\tan(0.5 \cdot \Delta\theta)$$

The n-th root computation circuitry 82 receives the division computation signal $X_1[n \cdot T_s]/X_3[n \cdot T_s]$ from the division computation circuitry 81. The n-th root computation circuitry 82 performs an n-th root computation on the absolute value of the division computation signal $X_1[n \cdot T_s]/X_3[n \cdot T_s]$ and outputs, to the frequency computation circuitry 83, an n-th root computation signal $N[n \cdot T_s]$ being the result of the n-th root computation.

$$N[n \cdot T_s] = \tan(0.5 \cdot \Delta\theta) \quad (16)$$

Here, since n in the n-th root computation is 0.5, $N[n \cdot T_s]$ is $[|-\tan^2(0.5 \cdot \Delta\theta)|]^{0.5}$.

The frequency computation circuitry 83 receives the n-th root computation signal $N[n \cdot T_s]$ from the n-th root computation circuitry 82 and performs an arctangent computation on the n-th root computation signal $N[n \cdot T_s]$ according to the following equation (17).

$$\tan^{-1}(|N[n \cdot T_s]|) = \tan^{-1}(|\tan(0.5 \cdot \Delta\theta)|) \quad (17)$$
$$= 0.5 \cdot \Delta\theta$$

Subsequently, the frequency computation circuitry 83 computes a frequency $f_X[n \cdot T_s]$ of the digital signal $X_{in}[n \cdot T_s]$ according to the following equation (18) by using $0.5 \cdot \Delta\theta$ being the result of the arctangent computation for the n-th root computation signal $N[n \cdot T_s]$.

$$f_X[n \cdot T_s] = (0.5 \cdot \Delta\theta) \cdot 2 \cdot f_s/(2\pi) \quad (18)$$
$$= \Delta\theta \cdot f_s/(2\pi)$$

Note that, according to the equation (18), the amount of change in phase $\Delta\theta$ for one sampling time always has a positive value as with the frequency $f_X[n \cdot T_s]$. Hence, phase sign conversion, such as described in the above-described Embodiment 1, is not required.

After the frequency $f_X[n \cdot T_s]$ of the digital signal $X_{in}[n \cdot T_s]$ is computed by frequency computation circuitry 83, the phase computation circuitry 84 computes a phase $\theta_X[n \cdot T_s]$ of the digital signal $X_{in}[n \cdot T_s]$, according to the following equation (19), by using the frequency $f_X[n \cdot T_s]$ of the digital signal $X_{in}[n \cdot T_s]$.

$$\theta_X[n \cdot T_s] = \Sigma[f_X[n \cdot T_s] \cdot (2\pi)/f_s] \quad (19)$$

In the Embodiment 3, by using the equations (18) and (19), the phase frequency computer 4 is able to detect the phase $\theta_X[n \cdot T_s]$ and frequency $f_X[n \cdot T_s]$ of the digital signal $X_{in}$ without performing a Hilbert transformation.

In addition, since the number of stages of delay circuitry used by the transversal filters 10 and 30 is two, the delay time resulting from detection is as short as two sampling times and thus a short-pulse input signal can be detected.

The Embodiment 3 represents that the division computation circuitry 81 computes a division computation signal $X_1[n \cdot T_s]/X_3[n \cdot T_s]$. Alternatively, the division computation circuitry 81 may compute a division computation signal $X_3[n \cdot T_s]/X_1[n \cdot T_s]$.

Note that, in this case, it is required to add $\pi/2$ to the result of an arctangent computation for an n-th root computation signal $N[n \cdot T_s]$. By the addition of $\pi/2$, the same value as that obtained in the equation (17) is obtained.

As is clear from the above, according to the Embodiment 3, the filter circuitry 1 is constituted by the transversal filters 10 and 30 connected in parallel to each other, where the transversal filters 10 and 30 change amplitude and phase of an input digital signal $X_{in}[n \cdot T_s]$ and output different digital signals $X_1[n \cdot T_s]$ and $X_3[n \cdot T_s]$ as respective resulting digital signals whose amplitude and phase have been changed. Further, the phase frequency computer 4 performs phase computation and frequency computation using the digital signals $X_1[n \cdot T_s]$ and $X_3[n \cdot T_s]$ output by the transversal filters 10 and 30, and thereby computes the phase $\theta_X[n \cdot T_s]$ and frequency $f_X[n \cdot T_s]$ of the input digital signal $X_{in}[n \cdot T_s]$. Thus, advantageous effects are provided that even if a digital signal $X_{in}[n \cdot T_s]$ to be input is a short-pulse signal, a phase $\theta_X[n \cdot T_s]$ and a frequency $f_X[n \cdot T_s]$ can be detected, and increase in circuitry size and increase in power consumption which result from increase in the number of stages of delay circuitry can be suppressed.

The Embodiment 3 represents an example that the transversal filter 10 is constituted by the subtraction-type first-order transversal filters 11 and 12, which are the first subtraction-type first-order transversal filter D shown in FIG. 2A, are connected in series with each other, and the transversal filter 30 is constituted by the addition-type first-order transversal filters 31 and 32, which are the first addition-type first-order transversal filter I shown in FIG. 2C, are connected in series with each other.

Note, however, that this is simply one example. The transversal filters 10 and 30 may have any combination of types of first-order transversal filters to be used.

For example, while the second subtraction-type first-order transversal filter −D shown in FIG. 2B may be used as the subtraction-type first-order transversal filters 11 and 12, the second addition-type first-order transversal filter −I shown in FIG. 2D may be used as the addition-type first-order transversal filters 31 and 32, and thereby the same advantageous effects can be achieved.

Embodiment 4

Figure 5:
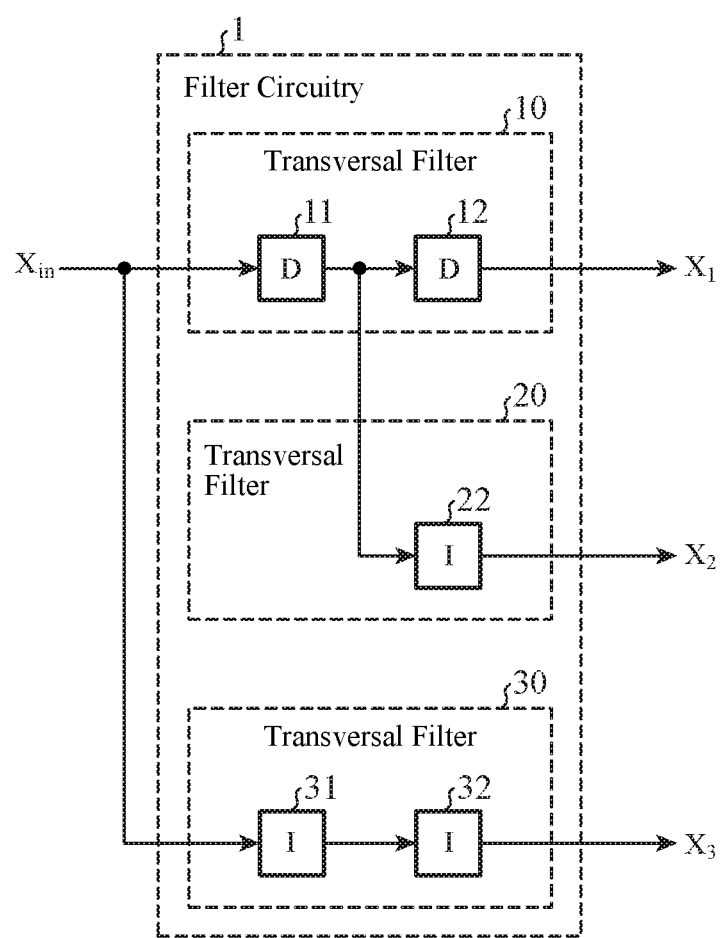
FIG. 5 is a configuration diagram illustrating filter circuitry 1 of a phase frequency detection device of Embodiment 4 of the invention.

FIG. 5 is a configuration diagram illustrating filter circuitry 1 of a phase frequency detection device of Embodiment 4 of the invention. In FIG. 5, the same reference signs as those in FIG. 1 indicate the same or corresponding portions.

The above-described Embodiment 1 represents that the transversal filter 20 is constituted by the subtraction-type first-order transversal filter 21 being the first subtraction-type first-order transversal filter D shown in FIG. 2A and the addition-type first-order transversal filter 22 being the first addition-type first-order transversal filter I shown in FIG. 2C, which are connected in series with each other. Alternatively, as shown in FIG. 5, a transversal filter 20 may be constituted by an addition-type first-order transversal filter 22 to which is input a digital signal output by a subtraction-type first-order transversal filter 11 of a transversal filter 10. The addition-type first-order transversal filter 22 is the first addition-type first-order transversal filter I shown in FIG. 2C.

In the case of FIG. 5, a digital signal $X_1'[n \cdot T_s]$ output by the subtraction-type first-order transversal filter 11 of the transversal filter 10 indicates the same value as a digital signal $X_2'[n \cdot T_s]$ output by the subtraction-type first-order transversal filter 21 of the transversal filter 20 of FIG. 1. Therefore, a digital signal $X_2[n \cdot T_s]$ output by the addition-type first-order transversal filter 22 of the transversal filter 20 indicates the same one as that in the above-described Embodiment 1.

Accordingly, the computation of a phase frequency computer 4 is the same as that in the above-described Embodiment 1, and thus, the same advantageous effects as those in the above-described Embodiment 1 can be achieved.

In addition, since the subtraction-type first-order transversal filter 21 is not required for the transversal filter 20, the circuitry size can be reduced over the above-described Embodiment 1.

Embodiment 5

Figure 6:
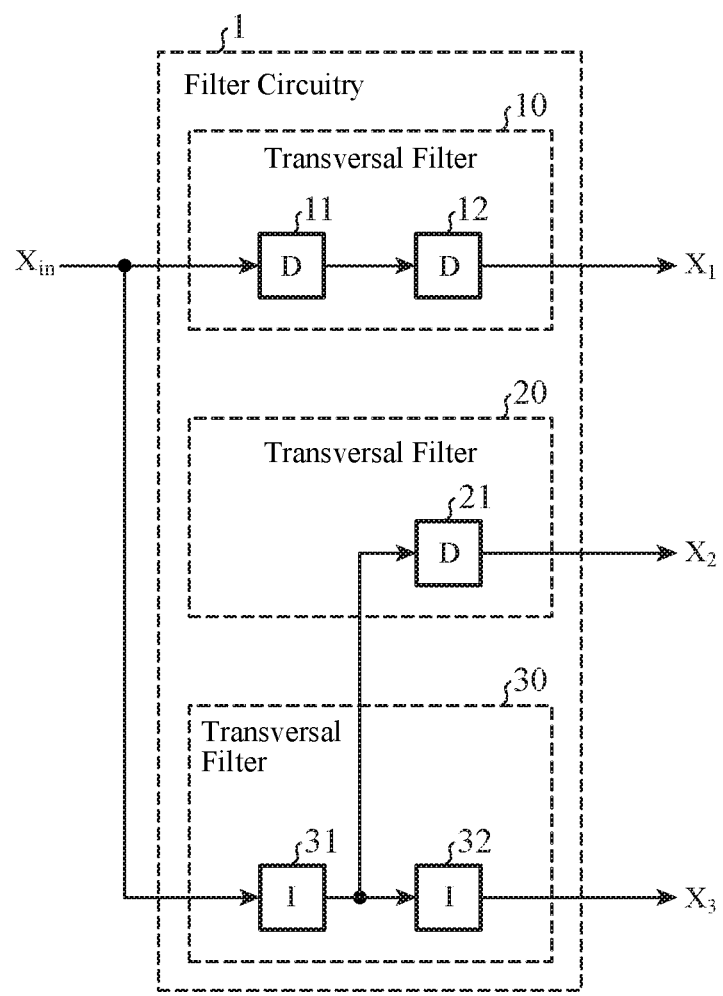
FIG. 6 is a configuration diagram illustrating filter circuitry 1 of a phase frequency detection device of Embodiment 5 of the invention.

FIG. 6 is a configuration diagram illustrating filter circuitry 1 of a phase frequency detection device of Embodiment 5 of the invention. In FIG. 6, the same reference signs as those in FIG. 1 indicate the same or corresponding portions.

The above-described Embodiment 1 represents that the transversal filter 20 is constituted by the subtraction-type first-order transversal filter 21 being the first subtraction-type first-order transversal filter D shown in FIG. 2A and the addition-type first-order transversal filter 22 being the first addition-type first-order transversal filter I shown in FIG. 2C, which are connected in series with each other. Alternatively, as shown in FIG. 6, a transversal filter 20 may be constituted by a subtraction-type first-order transversal filter 21 to which is input a digital signal output by an addition-type first-order transversal filter 31 of a transversal filter 30. The subtraction-type first-order transversal filter 21 is the first subtraction-type first-order transversal filter D shown in FIG. 2A.

In the case of FIG. 6, the transversal filter 20 is constituted by only the subtraction-type first-order transversal filter 21. Since a digital signal output by the addition-type first-order transversal filter 31 of the transversal filter 30 is input to the subtraction-type first-order transversal filter 21, the transversal filter 20 is substantially equivalent to a transversal filter in which the addition-type first-order transversal filter 31 is connected in series with the subtraction-type first-order transversal filter 21.

The connection order of the addition-type first-order transversal filter 31 and the subtraction-type first-order transversal filter 21 composing the above-described transversal filter is opposite to that of the subtraction-type first-order transversal filter 21 and the addition-type first-order transversal filter 22 in the transversal filter 20 of FIG. 1. However, even if the connection order is opposite, digital signals to be finally output are the same.

Hence, a digital signal $X_2[n \cdot T_s]$ to be output by the transversal filter 20 of FIG. 6, which is constituted by only the subtraction-type first-order transversal filter 21, indicates the same value as a digital signal $X_2[n \cdot T_s]$ to be output by the transversal filter 20 of FIG. 1.

Therefore, the computation of a phase frequency computer 4 is the same as that in the above-described Embodiment 1, and thus, the same advantageous effects as those in the above-described Embodiment 1 can be obtained.

In addition, since the transversal filter 20 does not require the addition-type first-order transversal filter 22, the circuitry size can be reduced over the above-described Embodiment 1.

Embodiment 6

Figure 7:
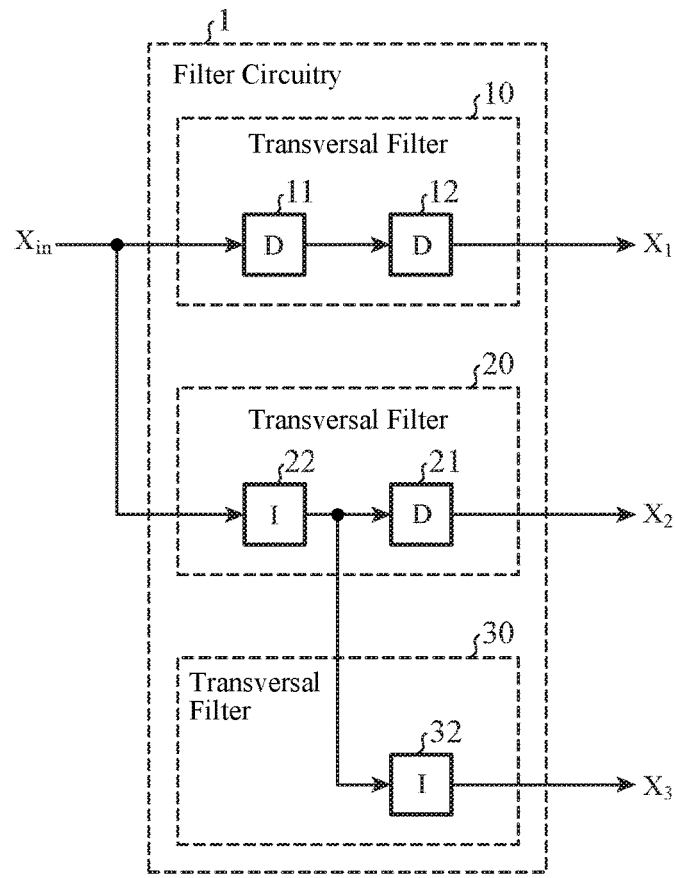
FIG. 7 is a configuration diagram illustrating filter circuitry 1 of a phase frequency detection device of Embodiment 6 of the invention.

FIG. 7 is a configuration diagram illustrating filter circuitry 1 of a phase frequency detection device of Embodiment 6 of the invention. In FIG. 7, the same reference signs as those in FIG. 1 indicate the same or corresponding portions.

The above-described Embodiment 1 represents that an input-side first-order transversal filter in the transversal filter 20 is the subtraction-type first-order transversal filter 21, an output-side first-order transversal filter is the addition-type first-order transversal filter 22, and the transversal filter 30 is constituted by the addition-type first-order transversal filters 31 and 32, each of which is the first addition-type first-order transversal filter I shown in FIG. 2C, are connected in series with each other.

In the Embodiment 6, as shown in FIG. 7, the order of a subtraction-type first-order transversal filter 21 and an addition-type first-order transversal filter 22 that compose a transversal filter 20 is switched so that the addition-type first-order transversal filter 22 can serve as an input-side first-order transversal filter while the subtraction-type first-order transversal filter 21 can serve as an output-side first-order transversal filter.

In addition, a transversal filter 30 is constituted by an addition-type first-order transversal filter 32 to which is input a digital signal output by the addition-type first-order transversal filter 22 in the transversal filter 20. The addition-type first-order transversal filter 32 is the first addition-type first-order transversal filter I shown in FIG. 2C.

In the case of FIG. 7, the connection order of the addition-type first-order transversal filter 22 and the subtraction-type first-order transversal filter 21 composing the transversal filter 20 is opposite to that of the subtraction-type first-order transversal filter 21 and the addition-type first-order transversal filter 22 that compose the transversal filter 20 of FIG. 1. However, even if the connection order is opposite, digital signals $X_2[n \cdot T_s]$ to be finally output are the same.

In addition, a digital signal $X_2'[n \cdot T_s]$ to be output by the addition-type first-order transversal filter 22 in the transversal filter 20 indicates the same value as a digital signal $X_3'[n \cdot T_s]$ to be output by the addition-type first-order transversal filter 31 in the transversal filter 30 of FIG. 1. Therefore, a digital signal $X_3[n \cdot T_s]$ to be output by the addition-type first-order transversal filter 32 in the transversal filter 30 indicates the same value as that in the above-described Embodiment 1.

Hence, the computation of a phase frequency computer 4 is the same as that in the above-described Embodiment 1, and thus, the same advantageous effects as those in the above-described Embodiment 1 can be obtained.

In addition, since the transversal filter 30 does not require the addition-type first-order transversal filter 31, the circuitry size can be reduced over the above-described Embodiment 1.

Embodiment 7

The above-described Embodiment 1 represents that the transversal filter 10 is constituted by the subtraction-type first-order transversal filters 11 and 12, each of which is the first subtraction-type first-order transversal filter D shown in FIG. 2A, are connected in series with each other. On the other hand, Embodiment 7 described below represents a transversal filter 10 constituted by different circuitries from those of the transversal filter 10 shown in FIG. 1.

Figure 8:
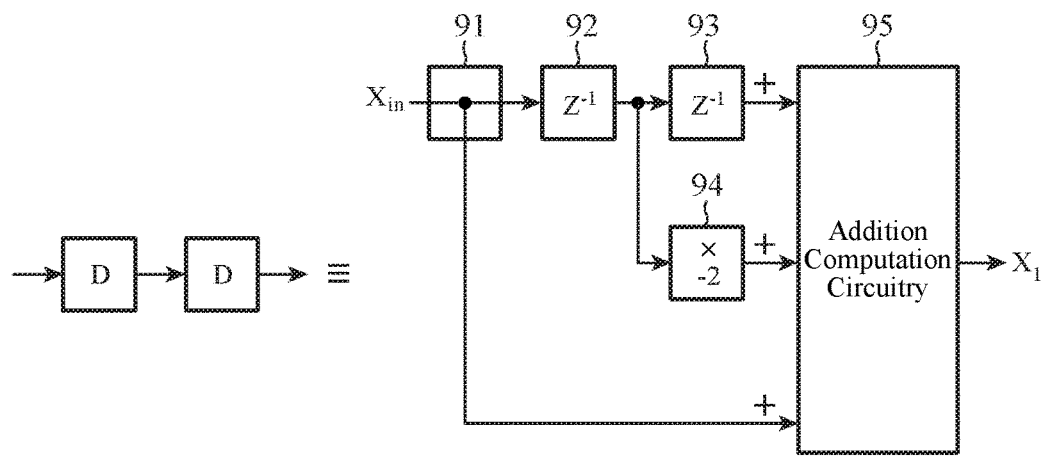
FIG. 8 is a configuration diagram illustrating a transversal filter 10 of a phase frequency detection device of Embodiment 7 of the invention.

FIG. 8 is a configuration diagram illustrating a transversal filter 10 of a phase frequency detection device of the Embodiment 7 of the invention.

In FIG. 8, splitter circuitry 91 splits an input digital signal $X_{in}$ into two.

One-sampling time delaying circuitry 92 is first delaying circuitry that delays one digital signal split by the splitter circuitry 91 by one sampling time $T_s$.

One-sampling time delaying circuitry 93 is second delaying circuitry that delays, by one sampling time $T_s$, the digital signal which has been delayed by the one-sampling time delaying circuitry 92.

Coefficient multiplication circuitry 94 multiplies, by a factor of −2, the digital signal having been delayed by the one-sampling time delaying circuitry 92.

Addition computation circuitry 95 performs an addition computation among the digital signal delayed by the one-sampling time delaying circuitry 93, the digital signal multiplied by the factor by the coefficient multiplication circuitry 94, and the other digital signal split by the splitter circuitry 91.

Next, operation will be described.

The addition computation circuitry 95 adds together: a digital signal delayed by two sampling times $T_s$ through the one-sampling time delaying circuitries 92 and 93; a digital signal that has been delayed by one sampling time $T_s$ through the one-sampling time delaying circuitry 92 before being multiplied by a factor of −2 at the coefficient multiplication circuitry 94; and a digital signal split by the splitter circuitry 91. A transfer characteristic $DF_1$ of the transversal filter 10, which has the constitution shown in FIG. 8, is given by the following equation (20).

$$DF_1 = Z^{-2} - 2 \cdot Z^{-1} + 1 \tag{20}$$

In equation (20), $Z^{-1}$ is a complex number of $\exp(-j\omega \cdot T_s)$ and denotes a delay of one sampling time. $Z^{-2}$ represents a delay of two sampling times.

On the other hand, the transfer characteristic $DF_1$ of the transversal filter 10 shown in FIG. 1 is given by the following equation (21). This is based on the constitution where the subtraction-type first-order transversal filters 11 and 12 being the first subtraction-type first-order transversal filter D shown in FIG. 2A are connected in series with each other.

$$DF_1 = (1 - Z^{-1})(1 - Z^{-1}) = Z^{-2} - 2 \cdot Z^{-1} + 1 \tag{21}$$

According to the equations (20) and (21), the transfer characteristic $DF_1$ of the transversal filter 10 of FIG. 8 is the same as the transfer characteristic $DF_1$ of the transversal filter 10 of FIG. 1. Therefore, the transversal filter 10 of FIG. 8 may be utilized in place of the transversal filter 10 of FIG. 1.

Embodiment 8

The above-described Embodiment 1 represents that the transversal filter 20 is constituted such that the subtraction-type first-order transversal filter 21 being the first subtraction-type first-order transversal filter D shown in FIG. 2A is connected in series with the addition-type first-order transversal filter 22 being the first addition-type first-order transversal filter I shown in FIG. 2C. Embodiment 8 described below is assumed that a transversal filter 20 is constituted by different circuitries from those of the transversal filter 20 shown in FIG. 1.

Figure 9:
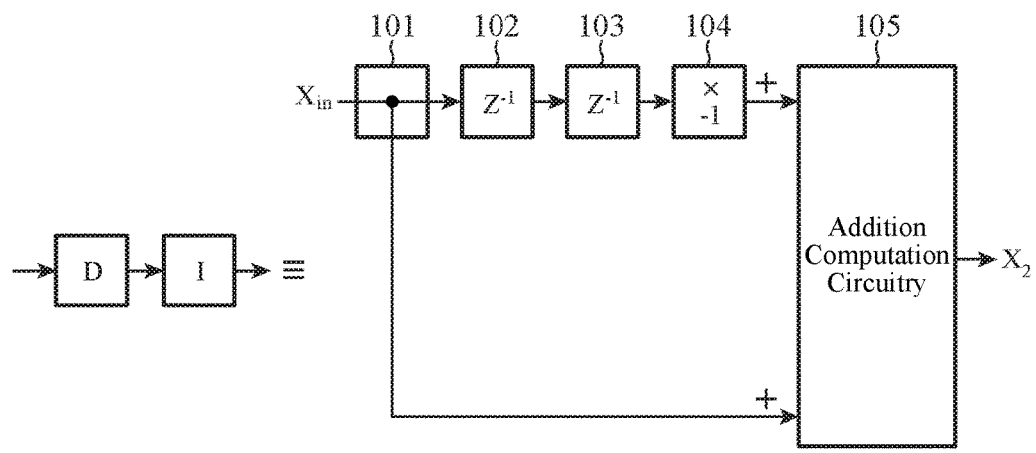
FIG. 9 is a configuration diagram illustrating a transversal filter 20 of a phase frequency detection device of Embodiment 8 of the invention.

FIG. 9 is a configuration diagram illustrating a transversal filter 20 of a phase frequency detection device of the Embodiment 8 of the invention.

In FIG. 9, splitter circuitry 101 splits an input digital signal $X_{in}$ into two.

One-sampling time delaying circuitry 102 is first delaying circuitry that delays one digital signal split by the splitter circuitry 101 by one sampling time $T_s$.

One-sampling time delaying circuitry 103 is a second delaying circuitry that delays, by one sampling time $T_s$, the digital signal which has been delayed by the one-sampling time delaying circuitry 102.

Coefficient multiplication circuitry 104 multiplies, by a factor of −1, the digital signal having been delayed by the one-sampling time delaying circuitry 103.

Addition computation circuitry 105 performs an addition computation between the digital signal multiplied by the factor by the coefficient multiplication circuitry 104 and the other digital signal split by the splitter circuitry 101.

Next, operation will be described.

The addition computation circuitry 105 adds together: a digital signal having been delayed by two sampling times $T_s$ through the one-sampling time delaying circuitries 102 and 103 before being multiplied by a factor of −1 by the coefficient multiplication circuitry 104; and a digital signal split by the splitter circuitry 101. The transfer characteristic $DF_2$ of the transversal filter 20 having the constitution shown in FIG. 9 is given by the following equation (22).

$$DF_2 = 1 - Z^{-2} \tag{22}$$

On the other hand, the transfer characteristic $DF_2$ of the transversal filter 20 of FIG. 1 is as shown in the following equation (23). This is based on the constitution where the subtraction-type first-order transversal filters 21 which is the first subtraction-type first-order transversal filter D shown in FIG. 2A is connected in series with the addition-type first-order transversal filter 22 which is the first addition-type first-order transversal filter I shown in FIG. 2C:

$$DF_2 = (1 - Z^{-1}) \cdot (1 + Z^{-1}) = 1 - Z^{-2} \tag{23}$$

According to the equations (22) and (23), the transfer characteristic $DF_2$ of the transversal filter 20 of FIG. 9 is the same as the transfer characteristic $DF_2$ of the transversal filter 20 of FIG. 1. Therefore, the transversal filter 20 of FIG. 9 may be utilized in place of the transversal filter 20 of FIG. 1.

Embodiment 9

The above-described Embodiment 1 represents that the transversal filter 30 is constituted by the addition-type first-order transversal filters 31 and 32, each of which is the first addition-type first-order transversal filter I shown in FIG. 2C, are connected in series with each other. Embodiment 9 described below represents a transversal filter 30 which is constituted by different circuitries from those of the transversal filter 30 of FIG. 1.

Figure 10:
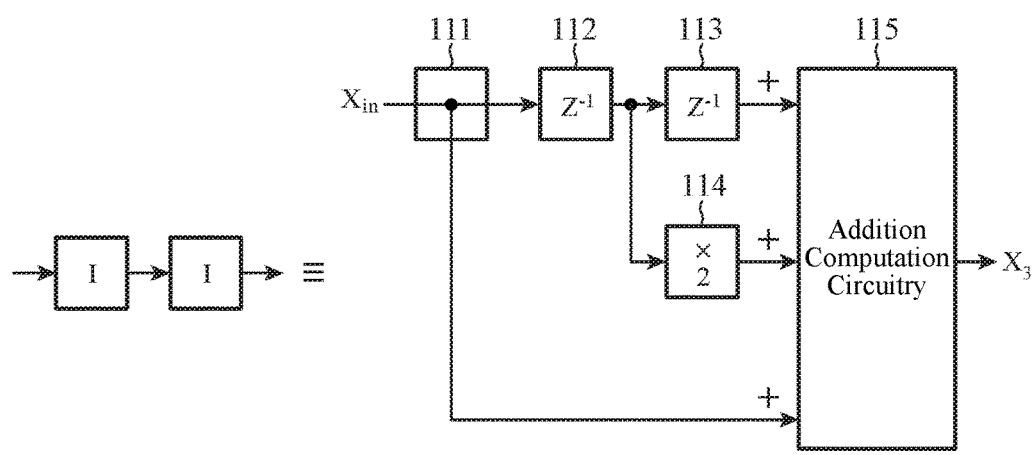
FIG. 10 is a configuration diagram illustrating a transversal filter 30 of a phase frequency detection device of Embodiment 9 of the invention.

FIG. 10 is a configuration diagram illustrating a transversal filter 30 of a phase frequency detection device of the Embodiment 9 of the invention.

In FIG. 10, splitter circuitry 111 splits an input digital signal $X_{in}$ into two.

One-sampling time delaying circuitry 112 is first delaying circuitry that delays one digital signal split by the splitter circuitry 111 by one sampling time $T_s$.

One-sampling time delaying circuitry 113 is second delaying circuitry that delays, by one sampling time $T_s$, the digital signal having been delayed by the one-sampling time delaying circuitry 112.

Coefficient multiplication circuitry 114 multiplies, by a factor of 2, the digital signal having been delayed by the one-sampling time delaying circuitry 112.

Addition computation circuitry 115 is circuitry that performs an addition computation among the digital signal delayed by the one-sampling time delaying circuitry 113, the digital signal multiplied by the factor by the coefficient multiplication circuitry 114, and the other digital signal split by the splitter circuitry 111.

Next, operation will be described.

The addition computation circuitry 115 adds together: a digital signal delayed by two sampling times $T_s$ through the one-sampling time delaying circuitries 112 and 113; a digital signal delayed by one sampling time $T_s$ by the one-sampling time delaying circuitry 112 before being multiplied by a factor of 2 at the coefficient multiplication circuitry 114; and a digital signal split by the splitter circuitry 111. The transfer characteristic $DF_3$ of the transversal filter 30 shown in FIG. 10 is given by the following equation (24).

$$DF_3 = Z^{-2} + 2 \cdot Z^{-1} + 1 \quad (24)$$

On the other hand, the transfer characteristic $DF_3$ of the transversal filter 30 shown in FIG. 1 is given by the following equation (25). This is based on the constitution where the addition-type first-order transversal filters 31 and 32, each of which is the first addition-type first-order transversal filter I shown in FIG. 2C, are connected in series with each other.

$$DF_3 = (Z^{-1} + 1) \cdot (Z^{-1} + 1) = Z^{-2} + 2 \cdot Z^{-1} + 1 \quad (25)$$

According to the equations (24) and (25), the transfer characteristic $DF_3$ of the transversal filter 30 shown in FIG. 10 is the same as the transfer characteristic $DF_3$ of the transversal filter 30 of FIG. 1. Therefore, the transversal filter 30 of FIG. 10 may be utilized in place of the transversal filter 30 of FIG. 1.

Embodiment 10

The above-described Embodiment 1 represents the filter circuitry 1 that is constituted by the transversal filters 10, 20, and 30. Each of the transversal filters 10, 20, and 30 may be constituted to include a digital filter for removing noise which has been superimposed on an input digital signal $X_{in}$.

Figure 11:
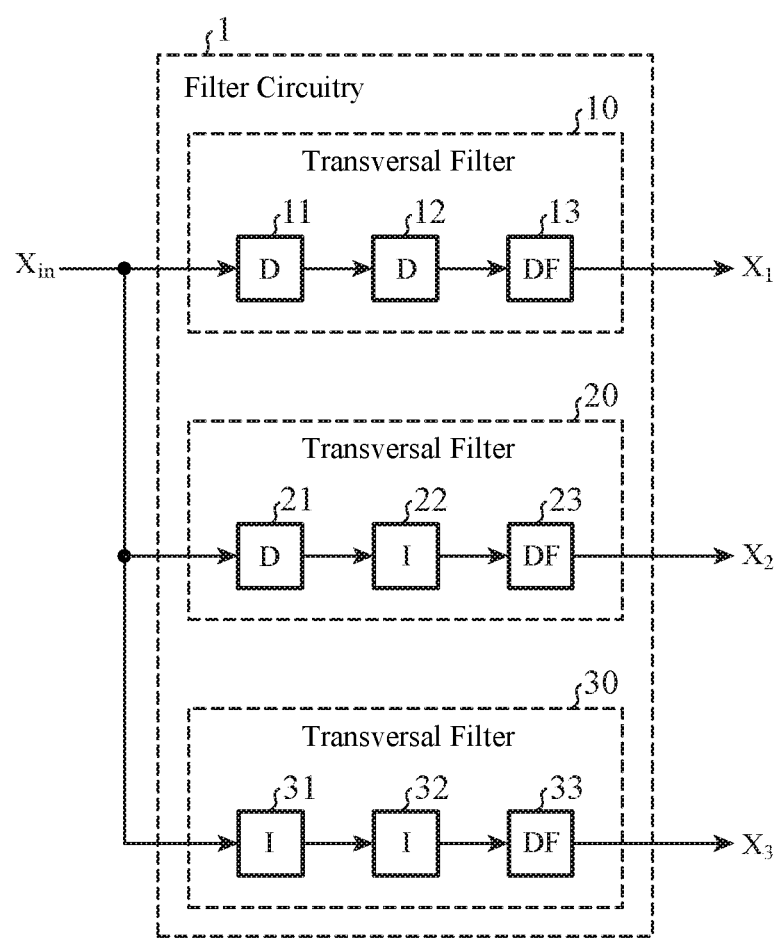
FIG. 11 is a configuration diagram illustrating filter circuitry 1 of a phase frequency detection device of Embodiment 10 of the invention.

FIG. 11 is a configuration diagram illustrating filter circuitry 1 of a phase frequency detection device of Embodiment 10 of the invention. In FIG. 11, the same reference signs as those in FIG. 1 indicate the same or corresponding portions and thus description thereof is omitted.

A digital filter 13 removes noise superimposed on a digital signal which is output by a subtraction-type first-order transversal filter 12.

A digital filter 23 removes noise superimposed on a digital signal which is output by an addition-type first-order transversal filter 22.

A digital filter 33 removes noise superimposed on a digital signal which is output by an addition-type first-order transversal filter 32.

The circuitry configuration of the digital filters 13, 23, and 33 is not particularly limited as long as the ones are capable of removing noise superimposed on a digital signal $X_{in}$. For example, an FIR (Finite Impulse Response) filter or an IIR (Infinite Impulse Response) filter may be used as each digital filter.

Note that, in order to detect a phase $\theta_X[n \cdot T_s]$ and a frequency $f_X[n \cdot T_s]$ of a digital signal $X_{in}[n \cdot T_s]$ by the phase frequency computer 4 of FIG. 1, the digital filters 13, 23, and 33 are required to have the same transfer characteristic DF among them.

FIG. 11 represents an example in which the digital filters 13, 23, and 33 are applied to the filter circuitry 1 of FIG. 1. The digital filters 13 and 33 may be applied to the filter circuitry 1 constituted by the two transversal filters 10 and 30 shown in FIG. 4.

Figure 12:
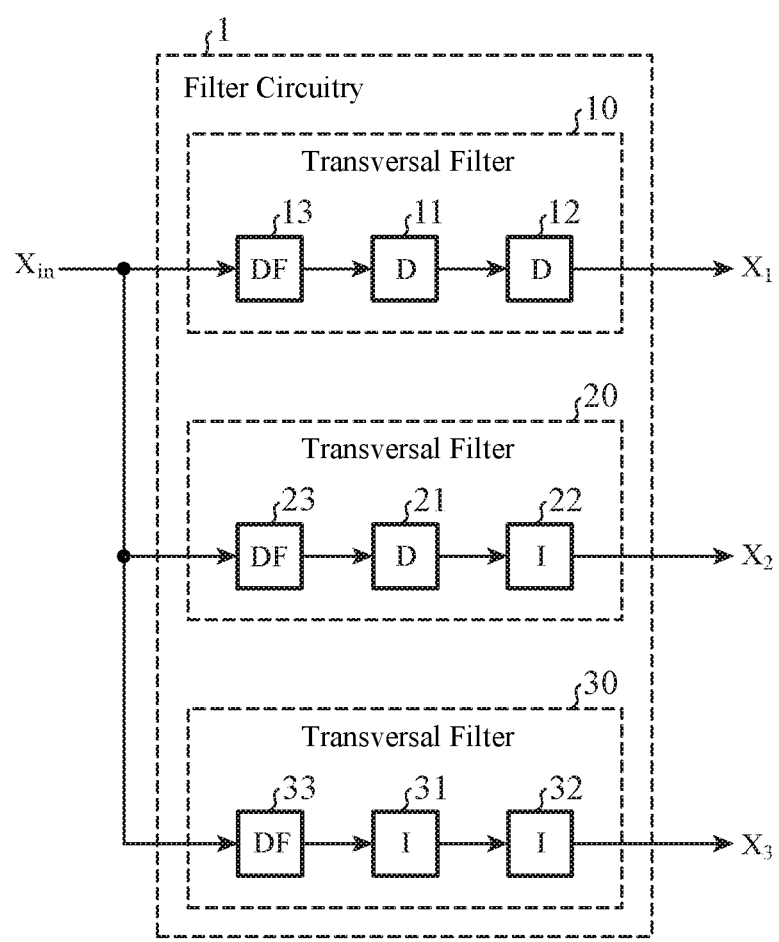
FIG. 12 is a configuration diagram illustrating filter circuitry 1 of a phase frequency detection device of the Embodiment 10 of the invention.

The Embodiment 10 represents that each of the digital filters 13, 23, and 33 of the corresponding transversal filters 10, 20, and 30 is disposed as an output stage of a series of the two first-order transversal filters. Alternatively, as shown in FIG. 12, each of the digital filters 13, 23, and 33 may be disposed as an input stage of the series of the two first-order transversal filters to remove noise superimposed on an input digital signal.

Figure 13:
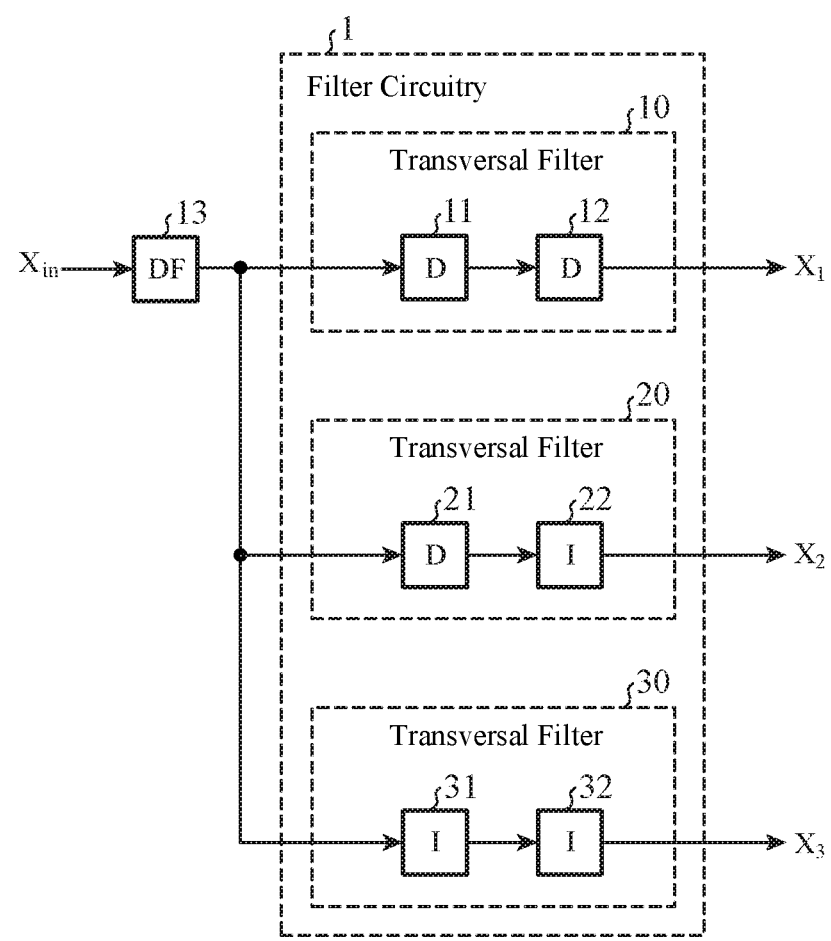
FIG. 13 is a configuration diagram illustrating filter circuitry 1 of a phase frequency detection device of the Embodiment 10 of the invention.

Further alternatively, as shown in FIG. 13, a digital filter 13 may be connected as a previous stage to the filter circuitry 1 to remove noise superimposed on an input digital signal.

Embodiment 11

Figure 14:
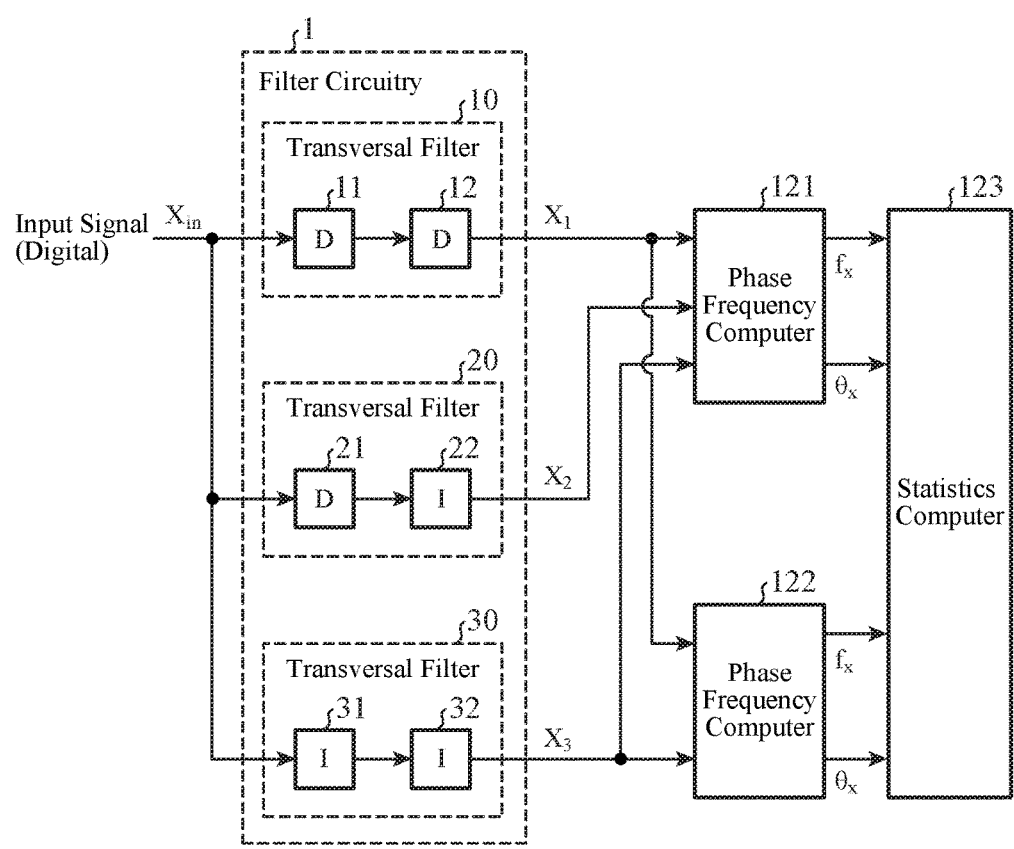
FIG. 14 is a configuration diagram illustrating a phase frequency detection device of Embodiment 11 of the invention.

FIG. 14 is a configuration diagram illustrating a phase frequency detection device of Embodiment 11 of the invention. In FIG. 14, the same reference signs as those in FIG. 1 indicate the same or corresponding portions and thus description thereof is omitted.

A phase frequency computer 121 has the same configuration as the phase frequency computer 4 of FIG. 1. The phase frequency computer 121 performs phase computation and frequency computation using digital signals $X_1$, $X_2$, and $X_3$ output by transversal filters 10, 20, and 30, and thereby computes a phase $\theta_X$ and a frequency $f_X$ of an input digital signal $X_{in}$.

A phase frequency computer 122 has the same configuration as the phase frequency computer 4 of FIG. 4. The phase frequency computer 122 performs phase computation and frequency computation that use the digital signals $X_1$ and $X_3$ output by the transversal filters 10 and 30, and thereby computes a phase $\theta_X$ and a frequency $f_X$ of the input digital signal $X_{in}$.

As presented in the above-described Embodiments 1 and 3, the phase frequency computer 4 of FIG. 1 and the phase frequency computer 4 of FIG. 4 differ from each other in contents of phase computation and frequency computation.

A statistics computer 123 performs a statistical computation using the phase $\theta_X$ computed by the phase frequency computer 121 and the phase $\theta_X$ computed by the phase frequency computer 122, and also performs a statistical computation using the frequency $f_X$ computed by the phase frequency computer 121 and the frequency $f_X$ computed by the phase frequency computer 122.

Next, operation will be described.

The phase frequency computer 121 computes a phase $\theta_X[n \cdot T_s]$ and a frequency $f_X[n \cdot T_s]$ of a digital signal $X_{in}[n \cdot T_s]$ in the same manner as the phase frequency computer 4 of FIG. 1.

The phase frequency computer 122 computes a phase $\theta_X[n \cdot T_s]$ and a frequency $f_X[n \cdot T_s]$ of the digital signal $X_{in}[n \cdot T_s]$ in the same manner as the phase frequency computer 4 of FIG. 4.

If the number of bits applied to digital computation performed by the phase frequency computers 121 and 122 is infinite, a quantization error does not occur in the digital computation. In this case, a phase $\theta_X[n \cdot T_s]$ obtained by the equation (12) and a phase $\theta_X[n \cdot T_s]$ obtained by the equation (19) have the same value as each other, and a frequency $f_X[n \cdot T_s]$ obtained by the equation (13) and a frequency $f_X[n \cdot T_s]$ obtained by the equation (18) have the same value as each other.

However, since the number of bits applied to digital computation performed by the phase frequency computers 121 and 122 has a finite value, the quantization error may occur.

Hence, the statistics computer 123 performs a statistical computation on the phase $\theta_X[n \cdot T_s]$ computed by the phase frequency computer 121 and the phase $\theta_X[n \cdot T_s]$ computed by the phase frequency computer 122, and also performs a statistical computation on the frequency $f_X[n \cdot T_s]$ computed by the phase frequency computer 121 and the frequency $f_X[n \cdot T_s]$ computed by the phase frequency computer 122.

Possible statistical computations for the two phases $\theta_X[n \cdot T_s]$ computed by the phase frequency computers 121 and 122 may be a computation of finding an average value of the two phases $\theta_X[n \cdot T_s]$, a computation of finding a weighted addition value, etc.

In addition, possible statistical computations for the two frequencies $f_X[n \cdot T_s]$ computed by the phase frequency computers 121 and 122 may be a computation of finding an average value of the two frequencies $f_X[n \cdot T_s]$, a computation of finding a weighted addition value, etc.

By those computations, the influence of quantization error occurring in digital computation of the phase frequency computers 121 and 122 can be reduced, enabling to obtain a highly accurate phase $\theta_X[n \cdot T_s]$ and frequency $f_X[n \cdot T_s]$.

The Embodiment 11 represents that the phase frequency computers 121 and 122 having different processing contents of phase computation and frequency computation are mounted, and the statistics computer 123 performs a statistical computation on the computation results of the phase frequency computers 121 and 122. Alternatively, three or more phase frequency computers having different processing contents of phase computation and frequency computation may be mounted, and the statistics computer 123 may perform a statistical computation on the computation results of the three or more phase frequency computers.

The Embodiment 11 represents that the phase frequency computers 121 and 122 having different processing contents of phase computation and frequency computation are mounted. Alternatively, filter circuitries 1 connected to previous stages to a plurality of phase frequency computers may have different configurations, and the statistics computer 123 may perform a statistical computation on the computation results of the plurality of phase frequency computers.

Figure 15:
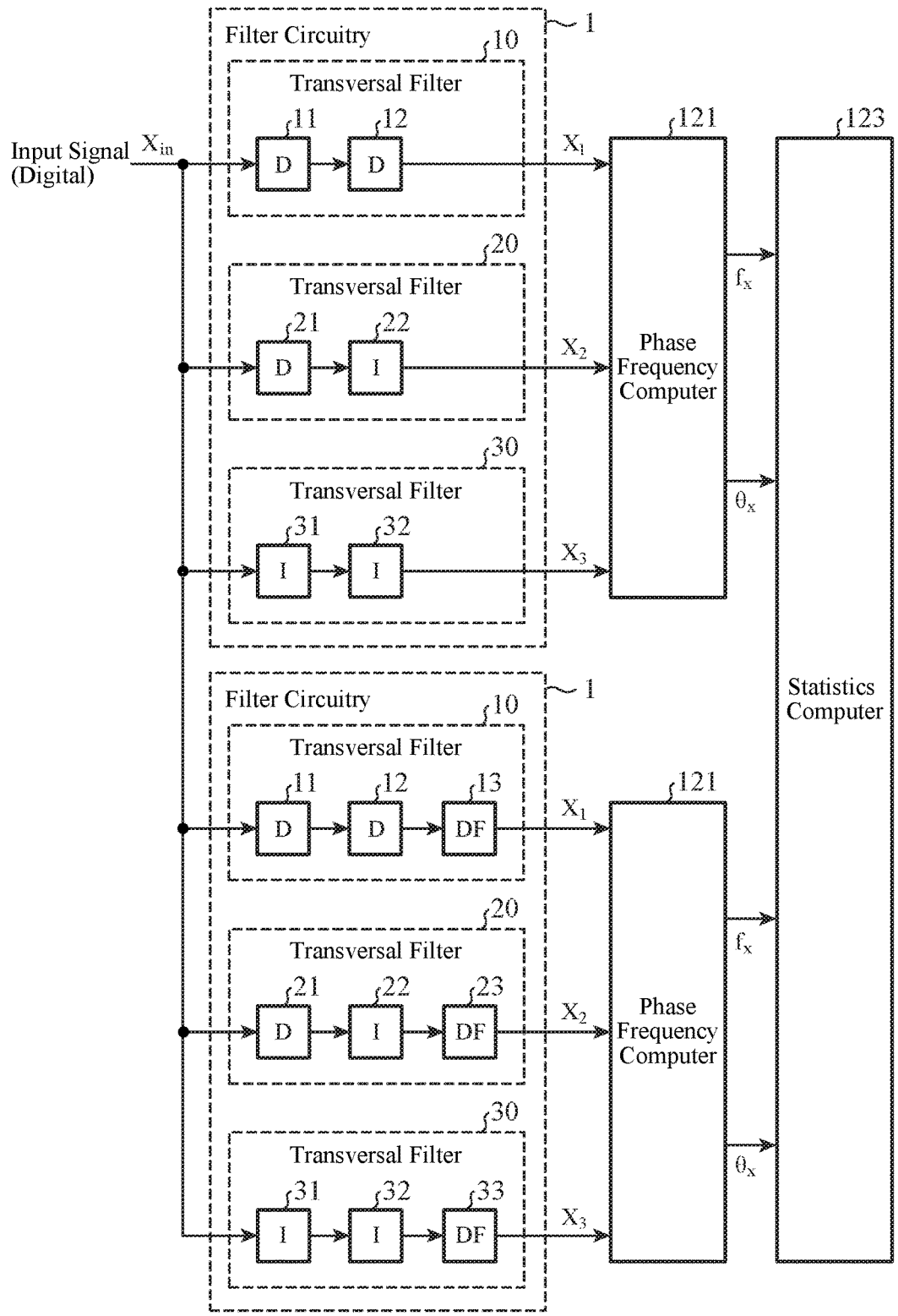
FIG. 15 is a configuration diagram illustrating a phase frequency detection device of the Embodiment 11 of the invention.

Specifically, for example as shown in FIG. 15, two phase frequency computers 121 may be provided. One of the two phase frequency computers 121 computes a phase $\theta_X[n \cdot T_s]$ and a frequency $f_X[n \cdot T_s]$ of a digital signal $X_{in}[n \cdot T_s]$ by using output signals from corresponding filter circuitry 1 constituted by transversal filters 10, 20, and 30, in which digital filters 13, 23, and 33 are not included. The other one of the two phase frequency computers 121 computes a phase $\theta_X[n \cdot T_s]$ and a frequency $f_X[n \cdot T_s]$ of the digital signal $X_{in}[n \cdot T_s]$ by using output signals from filter circuitry 1 constituted by transversal filters 10, 20, and 30, in which digital filters 13, 23, and 33 are included. According to this constitution, a statistics computer 123 performs a statistical computation on the phases $\theta_X[n \cdot T_s]$ computed by the two phase frequency computers 121 and also performs a statistical computation on the frequencies $f_X[n \cdot T_s]$ computed by the two phase frequency computers 121.

Also in this case, the influence of quantization error occurring in digital computation of the two phase frequency computers 121 is reduced, enabling to obtain a highly accurate phase $\theta_X[n \cdot T_s]$ and frequency $f_X[n \cdot T_s]$.

Note that free combinations of the embodiments, or modifications to any component in the embodiments, or omissions of any component in the embodiments which fall within the spirit and scope of the invention may be made to the invention of the present application.

Phase frequency detection devices according to the invention are suitable for devices that need to detect a phase $\theta_X$ and a frequency $f_X$ of an input digital signal $X_{in}$ even if the input digital signal $X_{in}$ is a short-pulse signal.

1: filter circuitry, 4: phase frequency computer, 10: transversal filter (first transversal filter), 11 and 12: subtraction-type first-order transversal filter, 13: digital filter, 20: transversal filter (second transversal filter), 21: subtraction-type first-order transversal filter, 22: addition-type first-order transversal filter, 23: digital filter, 30: transversal filter (third transversal filter, second transversal filter), 31 and 32: addition-type first-order transversal filter, 33: digital filter, 41: division computation circuitry (first division computation circuitry), 42: division computation circuitry (second division computation circuitry), 43: multiplication computation circuitry, 44: n-th root computation circuitry (root computation circuitry), 45: phase computation circuitry, 46: frequency computation circuitry, 51: splitter circuitry (first splitter circuitry), 52: one-sampling time delaying circuitry (first delaying circuitry), 53 and 54: subtraction computation circuitry, 61: splitter circuitry (second splitter circuitry), 62: one-sampling time delaying circuitry (second delaying circuitry), 63 and 64: addition computation circuitry, 71: multiplication computation circuitry (first multiplication computation circuitry), 72: multiplication computation circuitry (second multiplication computation circuitry), 73: division computation circuitry, 81: division computation circuitry, 82: n-th root computation circuitry (root computation circuitry), 83: frequency computation circuitry, 84: phase computation circuitry, 91: splitter circuitry, 92: one-sampling time delaying circuitry (first delaying circuitry), 93: one-sampling time delaying circuitry (second delaying circuitry), 94: coefficient multiplication circuitry, 95: addition computation circuitry, 101: splitter circuitry, 102: one-sampling time delaying circuitry (first delaying circuitry), 103: one-sampling time delaying circuitry (second delaying circuitry), 104: coefficient multiplication circuitry, 105: addition computation circuitry, 111: splitter circuitry, 112: one-sampling time delaying circuitry (first delaying circuitry), 113: one-sampling time delaying circuitry (second delaying circuitry), 114: coefficient multiplication circuitry, 115: addition computation circuitry, 121 and 122: phase frequency computer, and 123: statistics computer

The invention claimed is:

1. A phase frequency detection device comprising:
filter circuitry including a plurality of transversal filters which are connected in parallel to each other, the plurality of transversal filters changing amplitude and a phase of an input digital signal and outputting different digital signals as respective resulting digital signals whose amplitude and phase have been changed; and
a phase frequency computer to compute a phase and a frequency of the input digital signal by performing phase computation and frequency computation using the digital signals output by the plurality of transversal filters,
wherein
the filter circuitry is constituted such that a first transversal filter, a second transversal filter, and a third transversal filter, as the plurality of transversal filters, are connected in parallel to each other, and
the phase frequency computer includes:
first division computation circuitry to perform a division computation between a digital signal output by the first transversal filter and a digital signal output by the second transversal filter, and to output a first division computation signal being a result of the division computation;
second division computation circuitry to perform a division computation between a digital signal output by the third transversal filter and the digital signal output by the second transversal filter, and to output a second division computation signal being a result of the division computation;
multiplication computation circuitry to perform a multiplication computation between the first division computation signal output by the first division computation circuitry and the second division computation signal output by the second division computation circuitry, and to output a multiplication computation signal being a result of the multiplication computation;
root computation circuitry to perform a root computation on the multiplication computation signal output by the multiplication computation circuitry, and to output a root computation signal being a result of the root computation;
phase computation circuitry to compute a phase of the input digital signal by using the root computation signal output by the root computation circuitry and a sign of the first division computation signal or the second division computation signal; and
frequency computation circuitry to compute a frequency of the input digital signal by using the phase computed by the phase computation circuitry.

2. A phase frequency detection device comprising:
filter circuitry including a plurality of transversal filters which are connected in parallel to each other, the plurality of transversal filters changing amplitude and a phase of an input digital signal and outputting different digital signals as respective resulting digital signals whose amplitude and phase have been changed; and
A phase frequency computer to compute a phase and a frequency of the input digital signal by performing phase computation and frequency computation using the digital signals output by the plurality of transversal filters,
wherein
the filter circuitry is constituted such that a first transversal filter, a second transversal filter, and a third transversal filter, as the plurality of transversal filters, are connected in parallel to each other, and
the phase frequency computer includes:
first multiplication computation circuitry to perform a multiplication computation between a digital signal output by the first transversal filter and a digital signal output by the third transversal filter, and to output a first multiplication computation signal being a result of the multiplication computation;
second multiplication computation circuitry to perform a square multiplication on a digital signal output by the second transversal filter, and to output a second multiplication computation signal being a result of the square multiplication;
division computation circuitry to perform a division computation between the first multiplication computation signal output by the first multiplication computation circuitry and the second multiplication computation signal output by the second multiplication computation circuitry, and to output a division computation signal being a result of the division computation;
root computation circuitry to perform a root computation on the division computation signal output by the division computation circuitry, and to output a root computation signal being a result of the root computation;
phase computation circuitry to compute a phase of the input digital signal by using the root computation signal output by the root computation circuitry and a sign of the first multiplication computation signal; and
frequency computation circuitry to compute a frequency of the input digital signal by using the phase computed by the phase computation circuitry.

3. A phase frequency detection device comprising:
filter circuitry including a plurality of transversal filters which are connected in parallel to each other, the plurality of transversal filters changing amplitude and a phase of an input digital signal and outputting different digital signals as respective resulting digital signals whose amplitude and phase have been changed; and
a phase frequency computer to compute a phase and a frequency of the input digital signal by performing phase computation and frequency computation using the digital signals output by the plurality of transversal filters,
wherein
the filter circuitry is constituted such that a first transversal filter and a second transversal filter, as the plurality of transversal filters, are connected in parallel to each other, and
the phase frequency computer includes:
division computation circuitry to perform a division computation between a digital signal output by the first transversal filter and a digital signal output by the second transversal filter, and to output a division computation signal being a result of the division computation;
root computation circuitry to perform a root computation on the division computation signal output by the division computation circuitry, and to output a root computation signal being a result of the root computation;
frequency computation circuitry to compute a frequency of the input digital signal by using the root computation signal output by the root computation circuitry; and
phase computation circuitry for computing a phase of the input digital signal by using the frequency computed by the frequency computation circuitry.

4. A phase frequency detection device comprising:
   filter circuitry including a plurality of transversal filters which are connected in parallel to each other, the plurality of transversal filters changing amplitude and a phase of an input digital signal and outputting different digital signals as respective resulting digital signals whose amplitude and phase have been changed; and
   a phase frequency computer to compute a phase and a frequency of the input digital signal by performing phase computation and frequency computation using the digital signals output by the plurality of transversal filters,
   wherein
   each of the plurality of transversal filters is constituted by
      one or more subtraction-type first-order transversal filters connected in series with each other or
      one or more addition-type first-order transversal filters connected in series with each other or
      a subtraction-type first-order transversal filter and an addition-type first-order transversal filter, which are connected in series with each other,
   each of the subtraction-type first-order transversal filters is constituted by:
      first splitter circuitry to split an input digital signal;
      first delaying circuitry to delay one digital signal split by the first splitter circuitry by one sampling time; and
      subtraction computation circuitry to perform a subtraction computation between the digital signal delayed by the first delaying circuitry and the other digital signal split by the first splitter circuitry, and
   each of the addition-type first-order transversal filters is constituted by:
      second splitter circuitry to split an input digital signal;
      second delaying circuitry to delay one digital signal split by the second splitter circuitry (61) by one sampling time; and
      addition computation circuitry to perform an addition computation between the digital signal delayed by the second delaying circuitry and the other digital signal split by the second splitter circuitry.

5. The phase frequency detection device according to claim 4, wherein
   the filter circuitry is constituted such that a first transversal filter, a second transversal filter, and a third transversal filter, as the plurality of transversal filters, are connected in parallel to each other,
   the first transversal filter is constituted by two subtraction-type first-order transversal filters which are connected in series with each other,
   the second transversal filter is constituted by the subtraction-type first-order transversal filter and the addition-type first-order transversal filter, which are connected in series with each other, and
   the third transversal filter is constituted by two addition-type first-order transversal filters which are connected in series with each other.

6. The phase frequency detection device according to claim 4, wherein
   the filter circuitry is constituted such that a first transversal filter and a second transversal filter, as the plurality of transversal filters, are connected in parallel to each other, and
   the first transversal filter is constituted by two subtraction-type first-order transversal filters which are connected in series with each other, and
   the second transversal filter is constituted by two addition-type first-order transversal filters which are connected in series with each other.

7. The phase frequency detection device according to claim 4, wherein
   the filter circuitry is constituted such that a first transversal filter, a second transversal filter, and a third transversal filter, as the plurality of transversal filters, are connected in parallel to each other,
   the first transversal filter is constituted by two subtraction-type first-order transversal filters which are connected in series with each other,
   the second transversal filter is constituted by an addition-type first-order transversal filter to which is input a digital signal output by a preceding one in the two subtraction-type first-order transversal filters of the first transversal filter, and
   the third transversal filter is constituted by two addition-type first-order transversal filters which are connected in series with each other.

8. The phase frequency detection device according to claim 4, wherein
   the filter circuitry is constituted such that a first transversal filter, a second transversal filter, and a third transversal filter, as the plurality of transversal filters, are connected in parallel to each other,
   the first transversal filter is constituted by two subtraction-type first-order transversal filters which are connected in series with each other,
   the third transversal filter is constituted by two addition-type first-order transversal filters which are connected in series with each other, and
   the second transversal filter is constituted by a subtraction-type first-order transversal filter to which is input a digital signal output by a preceding one in the two addition-type first-order transversal filters of the third transversal filter.

9. The phase frequency detection device according to claim 4, wherein
   the filter circuitry is constituted such that a first transversal filter, a second transversal filter, and a third transversal filter, as the plurality of transversal filters, are connected in parallel to each other,
   the first transversal filter is constituted by two subtraction-type first-order transversal filters which are connected in series with each other,
   the second transversal filter is constituted by an input-side addition-type first-order transversal filter and an output-side subtraction-type first-order transversal filter, which are connected in series with each other; and
   the third transversal filter is constituted by an addition-type first-order transversal filter to which is input a digital signal output by the input-side addition-type first-order transversal filter of the second transversal filter.

* * * * *